US005455931A

United States Patent [19]

Camporese et al.

[11] Patent Number: 5,455,931
[45] Date of Patent: Oct. 3, 1995

[54] PROGRAMMABLE CLOCK TUNING SYSTEM AND METHOD

[75] Inventors: Peter J. Camporese, Hopewell Junction; Patrick J. Meaney, Poughkeepsie; Brian J. O'Leary, Hyde Park; Richard F. Rizzolo, Red Hook, all of N.Y.

[73] Assignee: International Business Machines Corporation, Armonk, N.Y.

[21] Appl. No.: 155,178

[22] Filed: Nov. 19, 1993

[51] Int. Cl.⁶ .................................................. G06F 1/04
[52] U.S. Cl. ............................................................ 395/550
[58] Field of Search ............................. 395/550, 575; 371/28, 61

[56] References Cited

U.S. PATENT DOCUMENTS

| | | | |
|---|---|---|---|
| 4,063,308 | 12/1977 | Collins et al. | 395/550 |
| 4,564,943 | 1/1986 | Collins et al. | 371/28 |
| 4,714,924 | 12/1987 | Ketzler | 340/825.21 |
| 4,851,995 | 7/1989 | Hsu et al. | 364/200 |
| 5,077,676 | 12/1991 | Johnson et al. | 364/489 |
| 5,122,679 | 6/1992 | Ishii et al. | 307/269 |
| 5,163,146 | 11/1992 | Antanaltis et al. | |

FOREIGN PATENT DOCUMENTS

| | | |
|---|---|---|
| 63-79123 | 4/1988 | Japan . |
| 2-232710 | 9/1990 | Japan . |

Primary Examiner—Thomas M. Heckler
Attorney, Agent, or Firm—Lawrence D. Cutter; Kevin P. Radigan

[57] ABSTRACT

A clock tuning system and method for a data processing system with enhanced timing failure diagnostics and unlayering capabilities. Both common and individual phase adjusting capabilities ensure programmable tuning of clock pulses distributed throughout a computer system, thereby facilitating isolation of timing margin failure to specific clock signals or enhancing system performance by shifting timing margin between logic paths. Both single-clock and dual-clock data processing are discussed, as well as clock tuning embodiments for each.

32 Claims, 27 Drawing Sheets

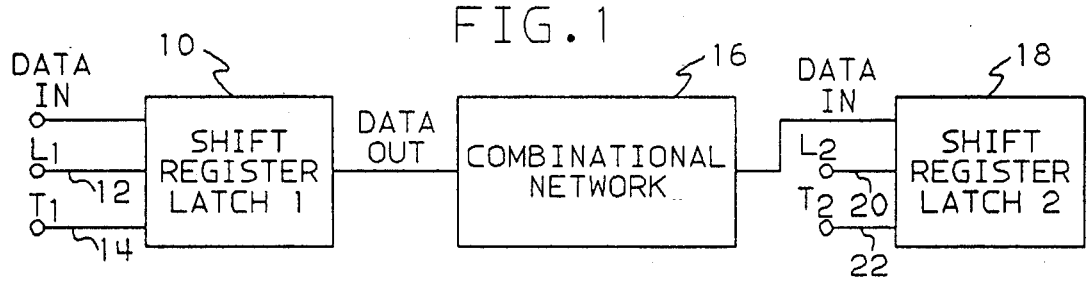
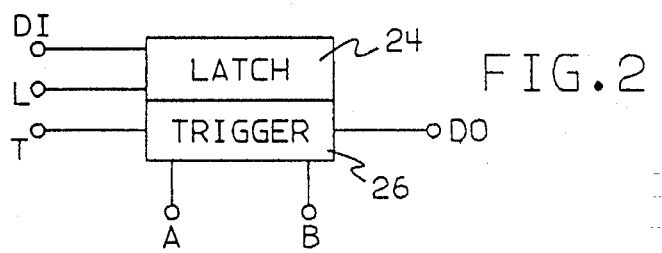
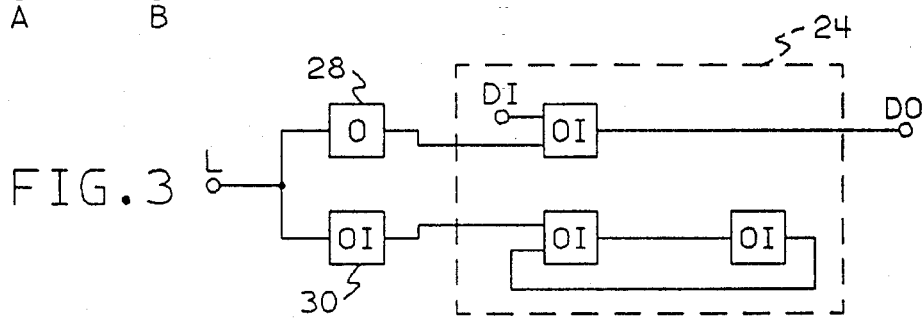
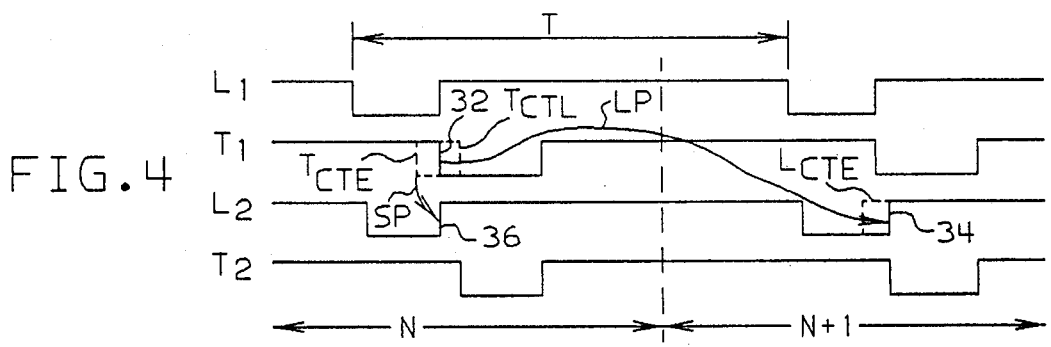
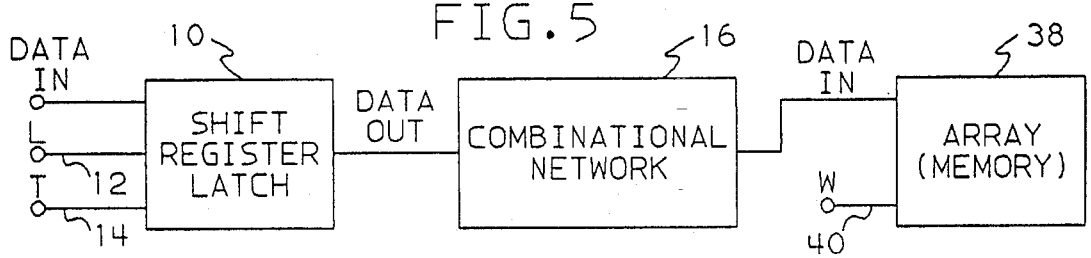

LP $T - T_{DD} - W_{CTE} - T_{CTL} - T_X$
SP $W_{CTL} + T_{CTE} + T_Y - T_{DO}$

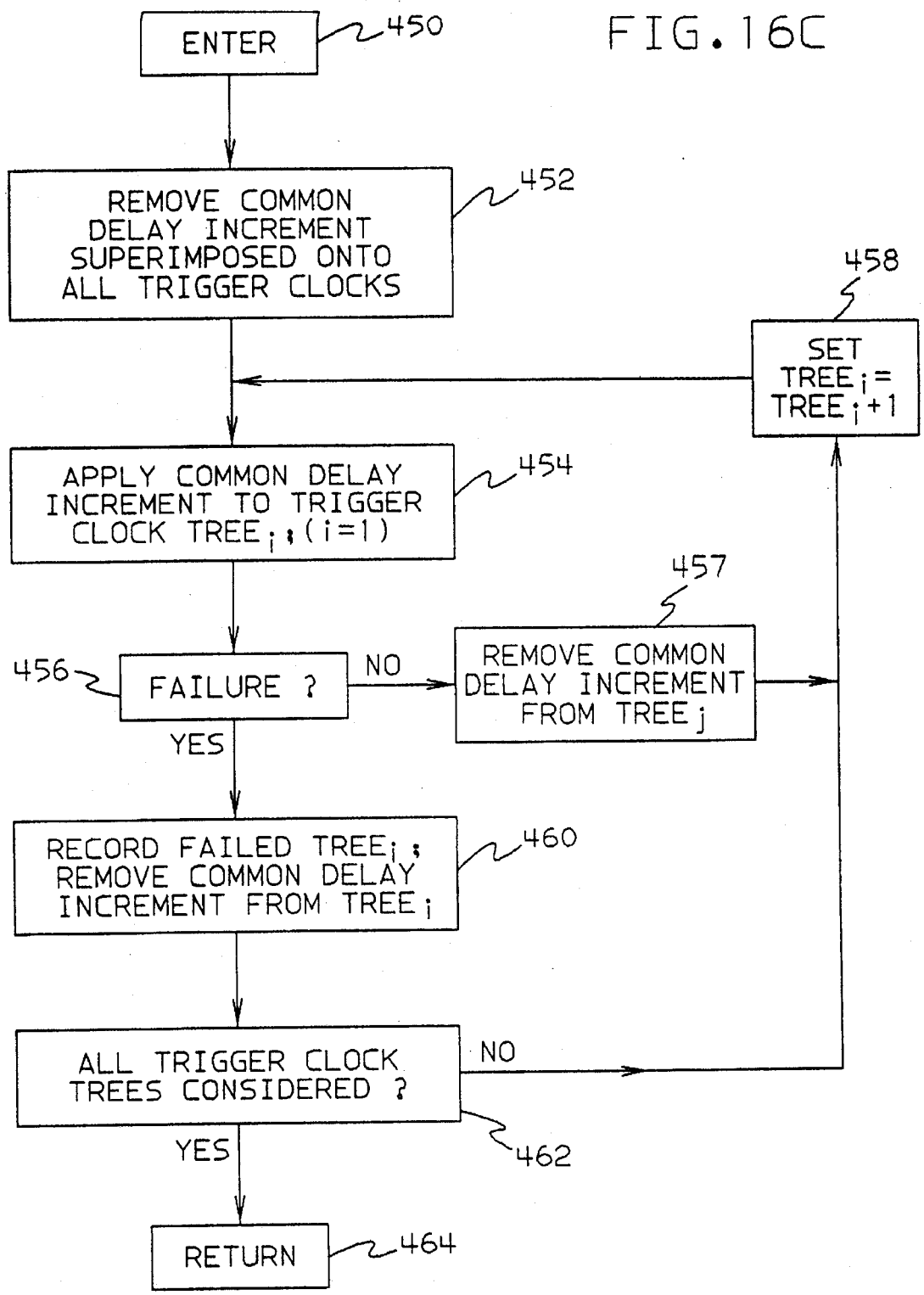

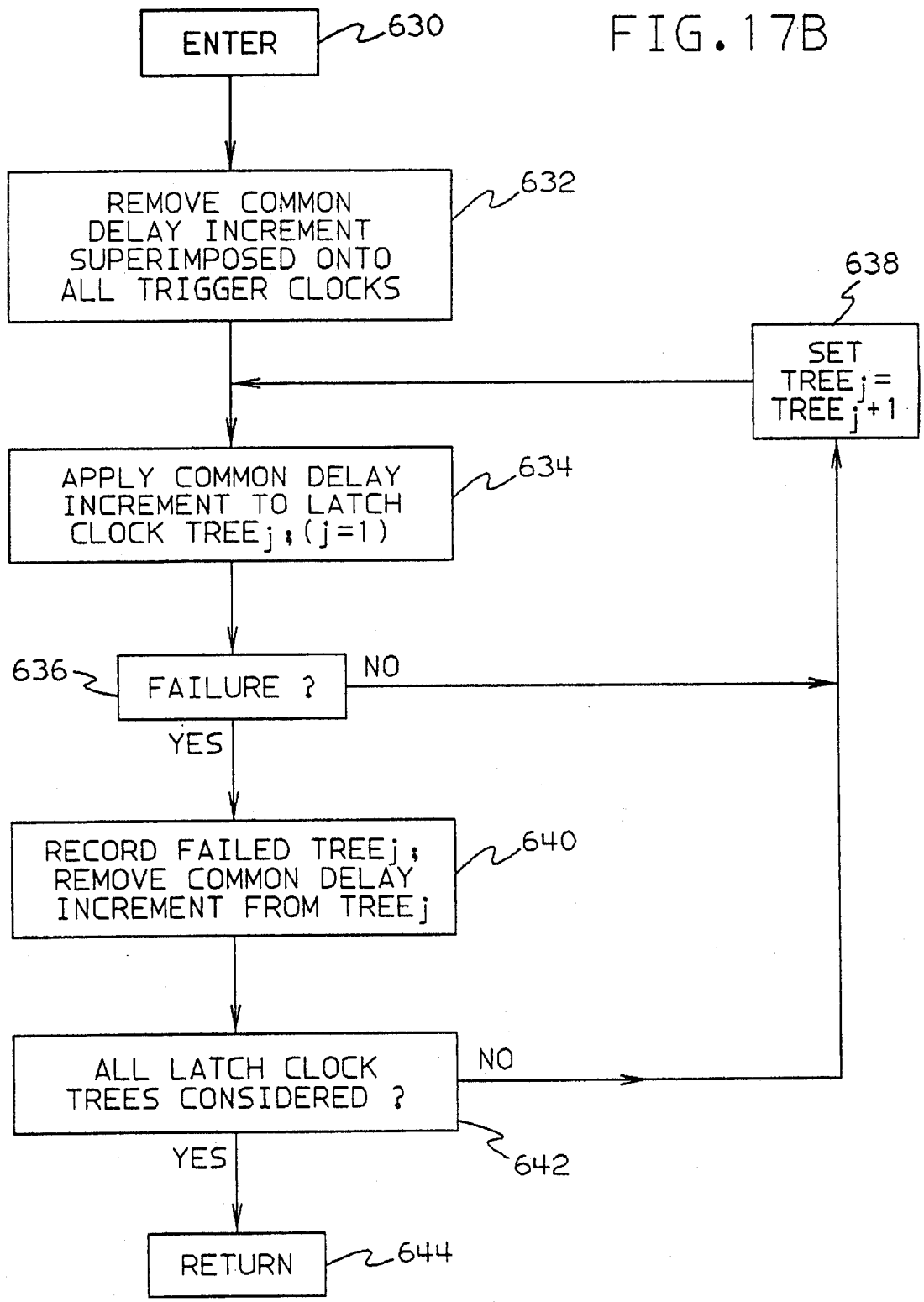

CYCLE=11NS

CYCLE=10NS

CYCLE=9NS

FIG. 20 CYCLE=8NS
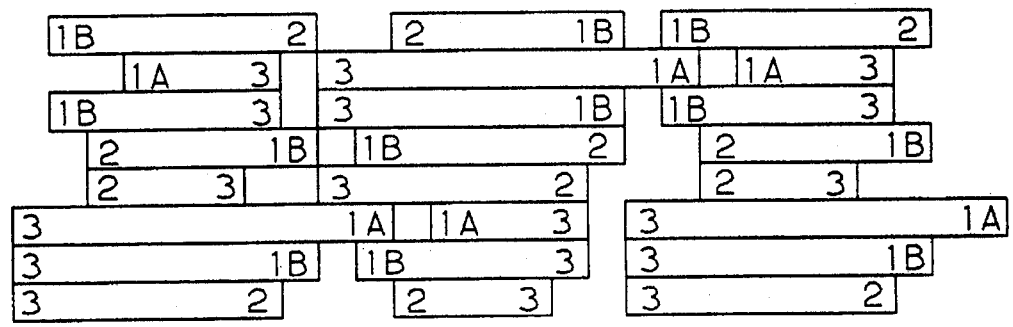
FIG. 21A
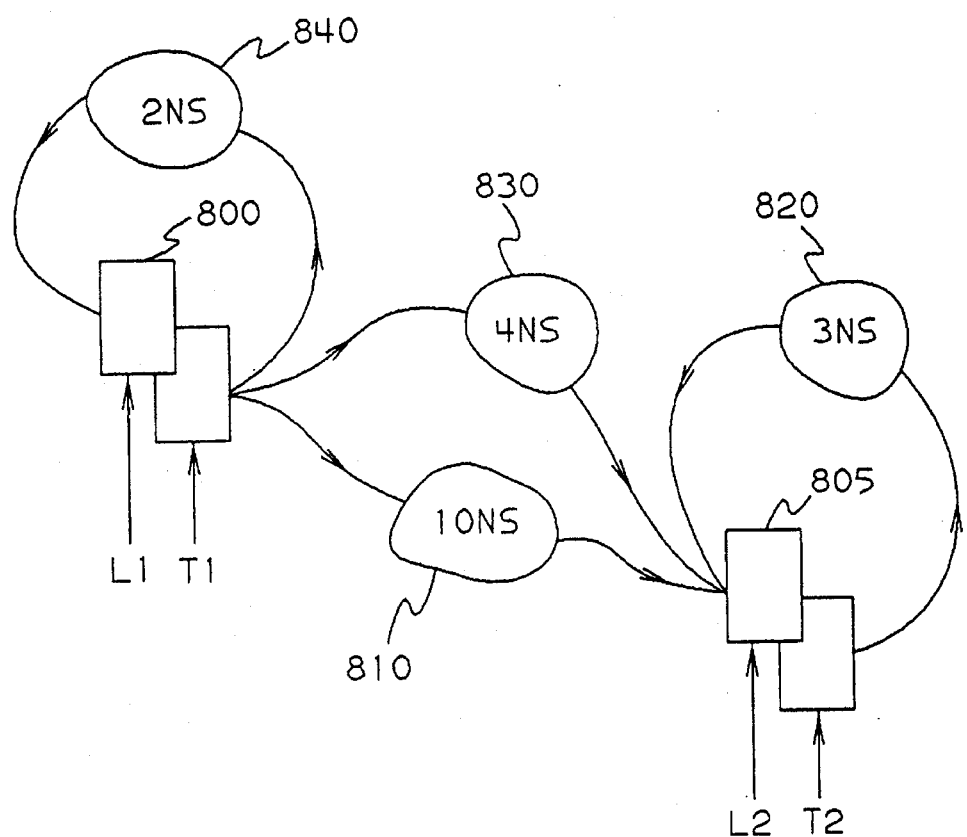

PROGRAMMABLE CLOCK TUNING SYSTEM AND METHOD

TECHNICAL FIELD

The present invention relates generally to computer system timing and debugging of system timing problems, and more particularly, to a programmable clock tuning system and method with individual clock stress capability for selective tuning (e.g., stressing) of clock pulses distributed throughout the computer system.

BACKGROUND ART

The development cycle of a new computer system typically involves extensive empirical hardware verification and debugging of system timing problems. The need for such activity can be traced to various factors, including: the limited accuracy of software timing tools employed to predict performance of physical nets in the system and the effect of unmodeled phenomena (i.e., clock skew, cycle stealing, etc.). Taken together, these factors tend to create a difference between predicted system performance and empirically measured system performance. As a result, once a system is built there is a significant amount of activity to: (1) meet performance objectives with specified minimum manufacturing margins; and (2) exceed performance objectives with specified margins where time permits. This subsequent effort involves empirically discovering and improving performance limiting (i.e., critical) paths or improving paths that do not have sufficient manufacturing margin. In practice, the speed with which critical paths are isolated and modified is a significant consideration in the ultimate performance of a computer system to be shipped. Two factors which retard this effort are the state-of-the-art of timing failure diagnostics and the state-of-the-art of unlayering processing.

Timing failure diagnostics refers to the isolation of a failure to a specific chip (or net). Today, limited failure diagnostics is accomplished by stressing in common (e.g., delaying) computer system clocks. The stressing capabilities of current clock systems typically allows failure isolation down to a clock tree level. A clock tree, however, can have multiple outputs (e.g., twenty different outputs to twenty different chips). Thus, further isolation is typically required. Also, error checking logic will often not isolate a problem to a specific chip of the computer system.

Unlayering processing refers to an ability to temporarily work around a known timing failure to identify a next system failure. This is done by delaying (i.e., stressing) the capturing clock signal to the failing logic, which in turn allows the continuation of failure discovery without having to apply a "permanent fix" to a currently identified failure. The application of permanent fixes often involves modification of system hardware, which is obviously an expensive and time consuming process. Unlayering is employed to minimize the time required to fix failures by allowing multiple failures to be successively identified, and therefore corrected in parallel in hardware. Unfortunately, available clock tuning systems have limited unlayering capabilities since an entire tree must be delayed. Clock stressing of an entire tree often causes new problems because a clock tree typically feeds many chips in a system.

Thus, a new programmable clock tuning system and method with enhanced timing failure diagnostics and unlayering capabilities is desirable to reduce development time of new computer systems, particularly, such a system and method wherein individual clock signals may be separately shifted.

DISCLOSURE OF INVENTION

Briefly summarized, the present invention comprises in one aspect a clock tuning system for use in a data processing system having multiple logic paths. The data processing system includes a first device which provides output data to a first logic path in response to a first clock signal and a second device which stores input data from the first logic path in response to a second clock signal. Further, the second device provides output data to a second logic path in response to the second clock signal and a third device captures input data from the second logic path in response to a third clock signal. The first logic path and the second the second logic path have their own timing margin. The clock tuning system provides the first clock signal, the second clock signal and the third clock signal to the first, second and third devices of the data processing system. The clock tuning system includes an individual clock adjusting means for varying the phase of the second clock signal such that the timing margin of the first logic path can be at least partially transferred to the timing margin of the second logic path or the timing margin of the second logic path can be at least partially transferred to the timing margin of the first logic path. Transfer of timing margin is used to either conduct timing margin analysis of the data processing system or to alleviate a questionable timing margin within the data processing system so that system performance can be enhanced. (Note that in the case where the first or second logic path is nonexistent, the path can be viewed as an existing path with unlimited timing margin.)

In another aspect, a programmable clock tuning system having a first logic means and a second logic means is provided. The first logic means is connected to receive a reference clock signal and output in response thereto a common clock signal. The first logic means includes programmable macro means for selectively superimposing a common phase adjustment onto the common clock signal output therefrom. The second logic means is coupled to receive the common clock signal output from the first logic means and output in response thereto a plurality of individual clock signals. The second logic means includes programmable micro means for selectively superimposing one of a plurality of individual phase adjustments onto each individual clock signal of said plurality of individual clock signals output therefrom. A controller is coupled to both the first logic means and the second logic means for controlling the programmable macro means' superimposing of a common phase adjustment onto the common clock signal and for controlling the programmable micro means' superimposing of individual phase adjustments onto at least some individual clock signals of the plurality of individual clock signals. The controller selects the common phase adjustment and the individual phase adjustments to either enhance performance of the data processing system or to conduct timing margin analysis of the data processing system.

In yet another aspect, the present invention comprises a method for conducting timing margin analysis of a data processing system having multiple logic paths timed by multiple clock signals. Each logic path has its own timing margin and a predefined acceptable timing margin exists for all of the multiple logic paths. The method includes the steps of: providing at least one common clock signal in response to an input clock signal; providing a plurality of individual clock signals in response to each common clock signal such that there is at least one plurality of individual clock signals; phase adjusting at least one common clock signal to aggravate at least some timing margins of the multiple logic paths in the data processing system; simultaneous with aggravating of timing margins, detecting whether a logic path of the multiple logic paths in the data processing system has a timing margin failure; and when timing margin failure is detected, identifying a particular individual clock signal from the at least one plurality of individual clock signals which either aggravates the detected timing margin failure or alleviates the detected timing margin failure.

In still another embodiment, the present invention provides a method for timing margin analysis of multiple logic paths in a data processing system. The data processing system is assumed to include at least two clock trees which provide clock signals of a first type and a second type. Each clock tree defines a common clock signal in response to an input clock signal and produces from its defined common clock signal a plurality of individual output clock signals. Each individual output clock signal is either of the first clock signal type or the second clock signal type. The method includes the steps of: conducting timing margin analysis of each clock tree providing a clock signal of the first type including separately aggravating each clock tree's common clock signal; simultaneous with aggravating at least one clock tree, conducting timing margin analysis of each clock tree providing a clock signal of the second type by separately alleviating the tree's common clock signals; and either isolating from an identified clock tree one individual clock signal of the first type which aggravates a timing margin failure or isolating one individual clock signal of the second type which alleviates a timing margin failure.

It is significant to note that the clock tuning system and method provided herein have individual clock stress capabilities which ensure selective tuning of clock pulses distributed throughout a data processing system. Timing analysis of a computer system can be performed in a matter of minutes, thereby allowing the unlayering of a significantly greater number of timing problems. By unlayering a greater number of timing margin problems, the machine's cycle speed is ultimately able to be increased which improves system performance and provides a competitive advantage. Again, the system and method presented allow isolation of timing margin failures down to specific clock signals.

BRIEF DESCRIPTION OF DRAWINGS

These and other objects, advantages and features of the present invention will be more readily understood from the following detailed description of certain preferred embodiments of the present invention, when considered in conjunction with the accompanying drawings in which:

FIG. 1 is a diagram illustrating one example of a common Shift Register Latch-to-Shift Register Latch (SRL) data transfer arrangement;

FIG. 2 is a more detailed illustration of an SRL of FIG. 1;

FIG. 3 is a more detailed diagram of the internal logic of the latch circuitry of FIG. 2;

FIG. 4 is a timing diagram illustrating the clock relationships in the SRL-to-SRL system of FIG. 1;

FIG. 5 is an illustration of a conventional array data path;

FIG. 16c is a flowchart of one embodiment for trigger clock tree margin discovery for the timing analysis processing of FIG. 16;

FIG. 17b is a flowchart of one embodiment for isolating aggravating latch clock trees for the timing analysis processing of FIG. 17;

FIG. 20 depicts further cycle time improvement for the illustration of FIG. 18 pursuant to an enhanced aspect of the present invention; and FIGS. 21a–21c depict timing diagrams of early mode versus late mode clocking trade-offs in a dual-phase clock system in accordance with the present invention.

BEST MODE FOR CARRYING OUT THE INVENTION

Figure 6:
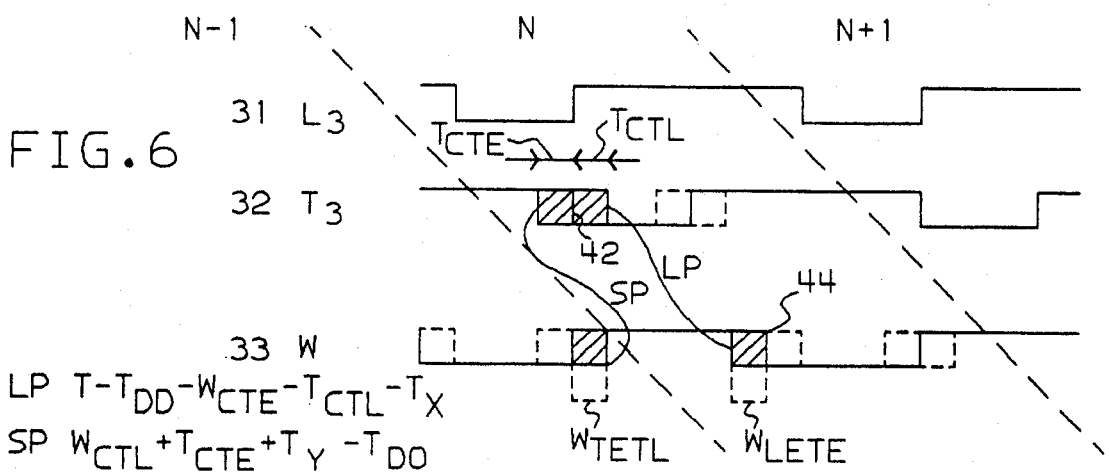
FIG. 6 is a timing diagram illustrating the clock relationships in the SRL-to-array data transfer arrangement of FIG. 5.

Prior to discussing detailed implementation of the invention, a more complete explanation of the state-of-the-art as represented by Collins et al., U.S. Pat. No. 4,564,943, entitled "System Path Stressing," assigned to the same assignee as this application, is provided. This patent is hereby incorporated herein by reference.

"Short path" and "long path" limits must first be explained. At the system level, data moves through combinational logic paths from one clocked storage element to another. Two types of system timing requirements are critical, i.e., the short path limit and the long path limit, defined for both logic and array data paths. These limits are the minimum ("early mode") and the maximum ("late mode") delay requirements of the data paths between clocked storage elements.

FIG. 1 illustrates one example of a typical logic path data transfer. At one end of the path is a sending (or launching) shift register latch (SRL) 10 which is controlled by a latch clock $L_1$ on line 12 and a trigger clock $T_1$ on line 14, to launch or send data into a combinational logic network 16. A receiving SRL 18 captures, or receives, the data from combinational logic network 16 under the control of a latch clock $L_2$ on line 20 and a trigger clock $T_2$ on line 22.

The SRLs 10 and 18 may be arranged as shown in more detail in FIGS. 2 & 3. Each SRL may consist of a latch portion 24, receiving input data at a data input terminal DI and latching the input data in response to a latch clock signal received at terminal L, and a trigger portion 26 (FIG. 2) that responds to a trigger clock at terminal T to launch the data from the data output terminal DO to the combinational logic network 16. The terminals A and B are shift control terminals. FIG. 3 illustrates in more detail the logic gate arrangement of a polarity-hold type latch, including a clock phase splitter comprising an OR gate 28 and an OR-INVERT, or NOR, gate 30. For a more detailed description of SRL design and operation, reference the above-cited U.S. Pat. No. 3,783,254 to Eichelberger, the disclosure of which is also incorporated herein by reference.

The effect of timing problems on logic data path transfer can be more easily understood with reference to the timing diagrams of FIG. 4. The long path is defined as the transfer of data from one cycle to the following cycle, or transfer from cycle N to cycle N+1, in a period of time less than the machine cycle time. The data is launched by the falling edge 32 of the trigger clock $T_1$ in cycle N, and is subsequently captured by the rising edge 34 of the receiving latch clock $L_2$ in cycle N+1. The leading (falling) edge of the trigger and trailing (rising) edge of the latch are nominally aligned with one another.

In an ideal long path, the entire cycle would be filled with machine logic. However, the length of the long path is shortened by inherent uncertainties in clock edge arrival time, and delays through the SRLs themselves. The arrival time uncertainties, or tolerance, are associated with essentially two factors. First, the variations of process, temperature and power supply directly affect circuit performance. Since the clock chips are composed of logic circuits that generate and distribute the clocks, the chips themselves cause the clock edges to have some tolerance. The second factor is wiring variations, including time of flight and characteristic impedance. The clock edges are subject to these variations, since all communications are through wires between chips. The SRL delay directly affects the long path, since it does take a finite amount of time to launch data out of the sending SRL, and to capture that data at the receiving SRL. This delay subtracts from the cycle time directly, and thus subtracts from the long path length.

The long path limit can be defined by the following equation:

$$LP \leq T - T_{CTL} - T_{CTE} T_{DD} - (L_{DD} + L_{FD})$$

where T is the machine cycle time, $T_{CTL}$ is the latest tolerance for the sending trigger arrival time, $L_{CTE}$ is the earliest tolerance for the receiving latch arrival time, $T_{DD}$ is the circuit delay through the sending trigger, $L_{DD}$ is the circuit delay in the receiving latch and $L_{FD}$ is the delay through the feedback portion of the receiving latch which guarantees that the data is captured. The terms $L_{DD}$ and $L_{FD}$ added together are generally referred to as the "latch setup time."

If the long path length is greater than the limit defined in the above equation, data will not be captured in the proper cycle, thereby causing incorrect data to be propagated. The long path defines the longest amount of delay which can be permitted through the combinational network 16 while still achieving proper data transfer. Thus, it can be seen that if the latch trailing edge arrives early and/or the trigger leading edge arrives late, the long path limit is shortened. This then reduces the amount of logic that can be performed in the combinational network, which is a major reason for long path failures.

The other critical timing consideration for proper data transfer is the short path limit. This consideration involves data launched by the sending trigger in cycle N but, due to either an early sending trigger or a late receiving latch, the data is captured by the receiving latch in the same cycle N rather than in the desired cycle N+1. FIG. 4 also shows the timing diagram for a short path. Data is launched by the falling edge 32 of the sending trigger $T_1$ and is again captured by a trailing edge of the receiving latch clock. However, due to the early occurrence of the trigger clock $T_1$, or due to the late occurrence of the receiving latch clock $L_2$, the data is captured at the receiving latch by the trailing edge 36 of the clock $L_2$, which is one cycle earlier than desired.

The minimum amount of acceptable short path delay can be conceptually understood from the illustration of FIG. 4. The delay through the combinational logic must be sufficiently long such that given the worst case of an early trigger clock and a late latch clock, the data launched by the trigger in cycle N will not arrive at the receiving latch until after the latch clock signal has already occurred in cycle N. The minimum short path may be defined as follows:

$$SP \geq T_{CTE} + L_{CTL} - T_{DD}$$

where $T_{CTE}$ is the earliest tolerance of the sending trigger clock arrival time, $L_{CTL}$ is the latest tolerance for the receiving latch clock arrival time, and $T_{DD}$ is the delay through the sending trigger. If the trigger clock leading edge arrives early, and/or the latched trailing edge arrives late, the minimum short path length is increased. This means that the logic path must be at least this length, or longer, to prevent data from being captured one cycle too soon, and to guarantee that data will be captured in the proper cycle. The delay of the sending trigger aids the short path because it is inherent in the path design, and the amount of delay therefore need not be taken into account in the logic path length design.

Again, the uncertainties of clock edge arrival time affect the long and short path lengths directly. The circuit tolerances are due to temperature, power supply and process variations, and the wire tolerances are due to time of flight and characteristic impedance variations. These tolerances have been minimized in the clock design, but have not been eliminated, and thus directly affect data path lengths.

Long path and short path restrictions also apply to array data paths, as shown in FIG. 5. In this case, the SRL 10 is disposed at one end of the data path and is controlled by latch and trigger clock signals on lines 12 and 14, respectively, as in the case of FIG. 1. At the other end of the data path is a clocked array 38, controlled by an array write clock 40 to write the received data into the proper address location. The array 38 may, for example, be a 4K RAM chip.

The specific timing for data transfer in the arrangement of FIG. 5 can be more clearly seen with reference to the timing diagram of FIG. 6. Data is launched by the trailing edge 42 of the trigger clock $T_3$ and is subsequently written into the array 38 at the leading edge 44 of the array write clock W. The long path is the data path from the leading edge of the sending trigger $T_3$ in cycle N to the leading edge of the array write clock W, also in cycle N. The array write clock is normally delayed into the same cycle as the sending trigger clock, and the write clock falling transition allows data to be written into the array.

The long path limit for the data transfer arrangement of FIGS. 5 & 6 may be defined by the following equation:

$$LP \leq T - T_{DD} - W_{CTE} - T_{CTL} - T_X$$

where T is the machine cycle time, $T_{CTL}$ is the latest tolerance for the sending trigger clock arrival time, $W_{CTE}$ is the earliest tolerance of the receiving write clock arrival time, $T_{DD}$ is the delay for the sending trigger, and $T_X$ is the minimum data set-up time of the array itself. The minimum data set-up time $T_X$ can be understood with reference to FIG. 7, i.e., it is a minimum amount of time for which the input data to the array must be allowed to stabilize before the clock signal becomes active. The trigger delay $T_{DD}$ subtracts from the long path because this delay is inherent in the SRL design. The minimum data set-up time $T_X$ also subtracts from the long path because it must be accounted for in order for the array to function properly. As indicated by the timing diagram of FIG. 6, if the trigger clock arrives late and/or the array clock arrives early, the long path decreases. The long path delay from the sending SRL to the receiving array must be less than this length to guarantee proper data transfer.

Figure 7:
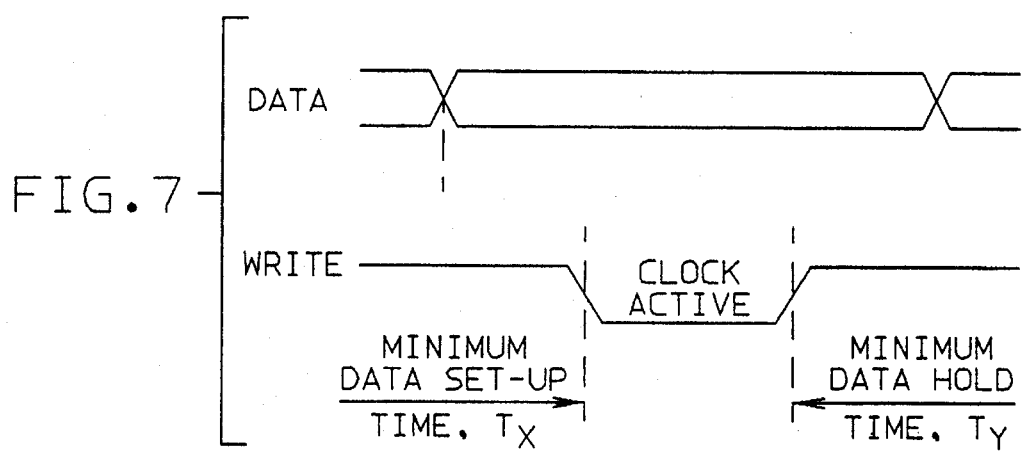
FIG. 7 is a general timing diagram illustrating the data and write clock relationships in a typical array.

The short path timing limitations for the array involve the launching of data in cycle N and, because the trigger occurs too early or the array write clock occurs too late, capturing of data by the array write clock of cycle N−1. Thus, in order to ensure that the data is not captured one cycle too early by the array, the propagation delay through the combinational logic 16 must be at least long enough so that, when the worst case of an early trigger clock and a late array write clock occurs, the data will not arrive at the array until after the trailing edge of the array write clock in cycle N−1. The short path limit may be defined by the following equation:

$$SP \geq W_{CTL} + T_{CTE} T_Y - T_{DD}$$

where $W_{CTL}$ is the latest tolerance of the write clock arrival time, $T_{CTE}$ is the earliest tolerance of the sending trigger clock arrival time, $T_{DD}$ is the delay time through the trigger, and $T_Y$ is the minimum hold time of the array. The hold time $T_Y$ is illustrated in FIG. 7 as the time required for the array clock to stabilize so that the newly provided data will not be immediately written into the array. The trigger delay $T_{DD}$ subtracts from the short path limit because it is inherent in the path and does not have to be accounted for in the path length. From the timing diagram of FIG. 6 and from the above equations, it can be seen that if the leading edge of the trigger clock arrives early and/or the array write clock arrives late, the short path limit is increased and the combinational path length must reflect this increase.

Thus, the criteria for path length limits to propagate valid data are that the data path length must be greater than or equal to the short path length and that the data path length must also be less than or equal to the long path length. If these two criteria are met, data should transfer through the machine properly, barring hardware problems.

The purpose of system path stressing is to isolate system errors that occur due to improper data transfer between clocked storage elements (i.e., timing problems) from hardware problems. This is accomplished be stressing the paths, i.e., by decreasing the long path design window until a long path failure occurs, or by increasing the minimum short path length until a short path failure occurs. This is done in an attempt to determine if errors are due to the timing of the clock distribution network, or whether an actual chip failure has occurred.

The long and short path lengths, as defined in the above equations, have inherent penalties that cannot be eliminated from the machine, such as clock edge arrival time uncertainty and SRL delays. (In this connection, it should be noted that the above equations include delay times of the trigger and latch circuits, and such terms are highly dependent on the type of latch used in the system. Different latch types and different SRL configurations may require the use of different parameters in the long and short path equations). In any event, although the edge arrival time uncertainty and the SRL delays cannot be removed, and since the minimum set-up and hold times of the array cannot be removed, the one entity in the above equations that can be changed is the nominal arrival time of the clock edges. The path lengths are directly controlled by when the clock edges arrive at the storage elements and, if the edges could be moved in time, either earlier or later, the path limits could be changed.

Two additional terms should be defined. If a path limit is changed by moving the relative position of the clock edges, the path will either be "stressed" or "relieved". Stressing causes the long path limit to become shorter, thereby decreasing the allowable propagation time through the combinational logic. The short path limit is stressed if the limit is made larger, thus increasing the minimum propagation delay time through the combinational logic. Conversely, the long path is relieved if the long path limit is made larger, and the short path is relieved if the short path limit is made smaller. Thus, "relieving" can also be thought of as negative stressing.

From the timing diagrams of FIGS. 4 & 6, it can be seen that the long and short paths are stressed and relieved in an interdependent fashion. For example, in the case of an SRL-to-SRL data transfer, if the latch clock $L_2$ is made to arrive later, the long path from the trigger clock leading edge 32 to the latch clock trailing edge 34 will be increased, thus relieving the long path. However, at the same time, the short path length from the leading edge 32 of the trigger clock $T_1$ to the trailing edge 36 of the latch clock $L_2$ will be increased, thereby stressing the short path. On the other hand, if the trigger clock $T_1$ is caused to arrive later, the long path is decreased, or stressed, and the short path in the same cycle is decreased, or relieved. Thus, if a particular path is stressed to test for a timing failure, the other path limit is simultaneously relieved. This interdependent nature of the logic long and short path stressing capabilities is highly useful.

The array data paths also exhibit this interdependence. If the trigger clock $T_3$ is made to arrive later, the long path from the trigger clock to the array write clock W is decreased, or stressed, and at the same time the short path from the trigger clock $T_3$ to the array write clock arrives late, the short path between the sending trigger clock and the receiving write clock is increased, or stressed, while the long path between the sending trigger and the receiving write clock is simultaneously increased, or relieved.

As can be appreciated from the above discussion, a failure can be brought about by decreasing the long path length or by increasing the short path length. These operations are referred to as "path stressing," or "aggravating timing margins." Also, timing problems can be reduced by increasing the long path length or decreasing the short path length, referred to as "alleviating timing margins."

There are many applications for system path stressing. Timing errors can be incrementally debugged, timing relationships between elements verified, timing margins tested, system deterioration detected and intermittent errors caught. System path stressing can be applied during engineering bring-up, manufacturing bring-up, or in the field. In the field, stressing data paths can cause an intermittent failure to become a solid failure by changing the relationships of the launching and capturing clocks. This will then isolate the timing problem to a short or long path, whichever causes the failure. Path stressing can also detect system deterioration in terms of temperature or power supply drift. Drift affects the arrival times of the clocks, and path stressing can be used to position the clocks to determine the relative closeness of a failure point. Finally, with pre-existing path stressing the machine could be run in a partially degraded mode. For instance, if a glitch is causing erroneous data to be transferred through the system, existing path stressing could be adjusted to relieve the data transfer error, albeit at an added increase in cycle time and consequent reduced operating speed. Running at a reduced operating speed, however, might be preferable to having a system fail entirely.

An example of existing system path stressing is described below with reference to FIGS. 8–10.

A clock generation and distribution network is an integral part of any high performance machine structure. The clock system is responsible for proper data transfer between clocked storage elements, including SRLs residing on logic chips, and array, or memory, chips. The clock system transfers this data according to precisely defined timing relationships. If these timing criteria are not met, for example as described above, incorrect or improper data propagates through the machine. Thus, practically every logic and array chip in the machine interacts with the clock distribution network to some extent.

At the system level, the clock distribution structure consists of a predetermined set of logic chips that communicate with each other through many wiring connections. These chips are responsible for the generation and distribution of all of the various clock types for the logic and array chips in the machine. This structure also interfaces with the users of the clocks, the logic and array chips in the machine and also with those components that provide the controlling capability to the clock system, e.g., the processor controller, and the Logic Support Station, or LSS.

As is well known, use of a Level Sensitive Scan Design (LSSD) in a digital computer minimizes race conditions, hazards and AC timing dependencies. Functional logic units are made solely dependent on the occurrence of signals from plural clock trains. This is accomplished by using clocked dc latches for all internal storage circuitry. The plural clock trains are synchronous and independent, and the various sets of latch circuitry are coupled through combinational logic to other sets of latches controlled by other system clock trains. For a more complete description of a level sensitive logic system, refer to commonly assigned U.S. Pat. Nos. 3,783,254 to Eichelberger, and 4,063,80 to Eichelberger et al., along with the references cited therein.

During bring-up operation, all testing diagnosis assumes a Level Sensitive Scan Design (LSSD) type machine. One LSSD requirement calls for the latches to be controlled by two non-overlapping clocks. If overlap occurs by design or edge arrival uncertainty, stressing can be employed to "unoverlap" the clocks so that the test cases can run. Thus, a non-LSSD machine could be made to operate as an LSSD compatible machine.

The bring-up application of path stressing is somewhat involved since when the power is turned on, timing problems should be eliminated or at least minimized so that functional testing can begin. The main emphasis of a bring-up operation is to make sure hardware is working from a functional standpoint. After this has been accomplished, the hardware can be run at normal operating speed. There are two distinct bring-up operations to test for functionality: one for logic data paths and the other for array data paths. Each one deals with isolating the timing errors from other hardware errors, such as an array byte or logic byte failure. Bring-up procedure could be accomplished by first testing the logic data path and then the array data paths, or the reverse. For more detailed discussion of bring-up testing employing a process such as that set forth in FIGS. 8–10, reference should be made to the above-incorporated U.S. Pat. No. 4,564,943 to Collins et al.

Figure 8:
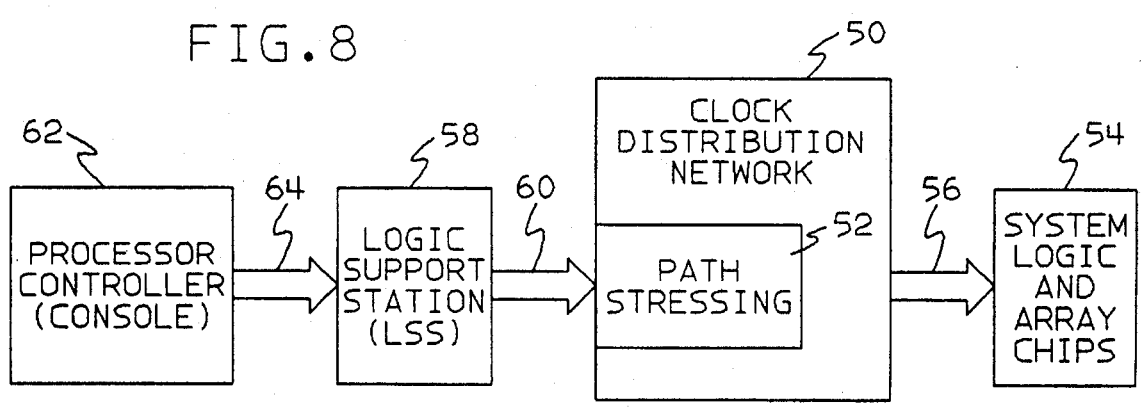
FIG. 8 is an overall diagram of a clock distribution network and associated interfaces of a path stressing system.

In FIG. 8, the clock distribution network 50 includes the clock chips and associated wiring. The path stressing portion 52 is entirely contained within the clock distribution network. Clock distribution network 50 provides the clock signals to the logic and array chips, generally illustrated as a system network 54, through an interface consisting of a plurality of lines 56. It is within system network 54 that the clocks transfer data between latches on the logic chips, and between logic and array chips. No data are transferred between the clock distribution network 50 and the system network 54. Only clock signals are provided.

The controlling capability of clock distribution network 50, in general, and the path stressing function 52 in particular, is through the interface with the Logic Support Station (LSS) 58. The LSS controls all of the maintenance-related functions of the machine, including maintenance partitioning, fencing, and SRL initialization. The LSS sends to the path stressing portion 52, via the multiple-line interface 60, a set of control bits that the clock distribution network uses to logically control the path stressing operation. These control bits originate at the processor controller, or console, 62, and are sent to the LSS via a plurality of lines 64, which then sends the control bits to the clock distribution network.

Console 62 is the operator-machine interface that controls the execution of path stressing. A customer engineer or bring-up technician can load in many types of operations at the console, one of which is a path stressing operation. The operator then has direct control of the path stressing application to be executed. The operator, via console 62, selects a particular logic subsystem to be stressed, and appropriate clock control sections and subsystem clocks are stopped. The operator then enters into the console the appropriate control bits to be loaded into a stress status register in the LSS 58, and the system clocks are restarted. The machine runs for a number of clock cycles with the appropriate stress implemented, and any logic path errors that occur are detected and reported to the console 62 via the LSS in a well known manner.

Figure 9:
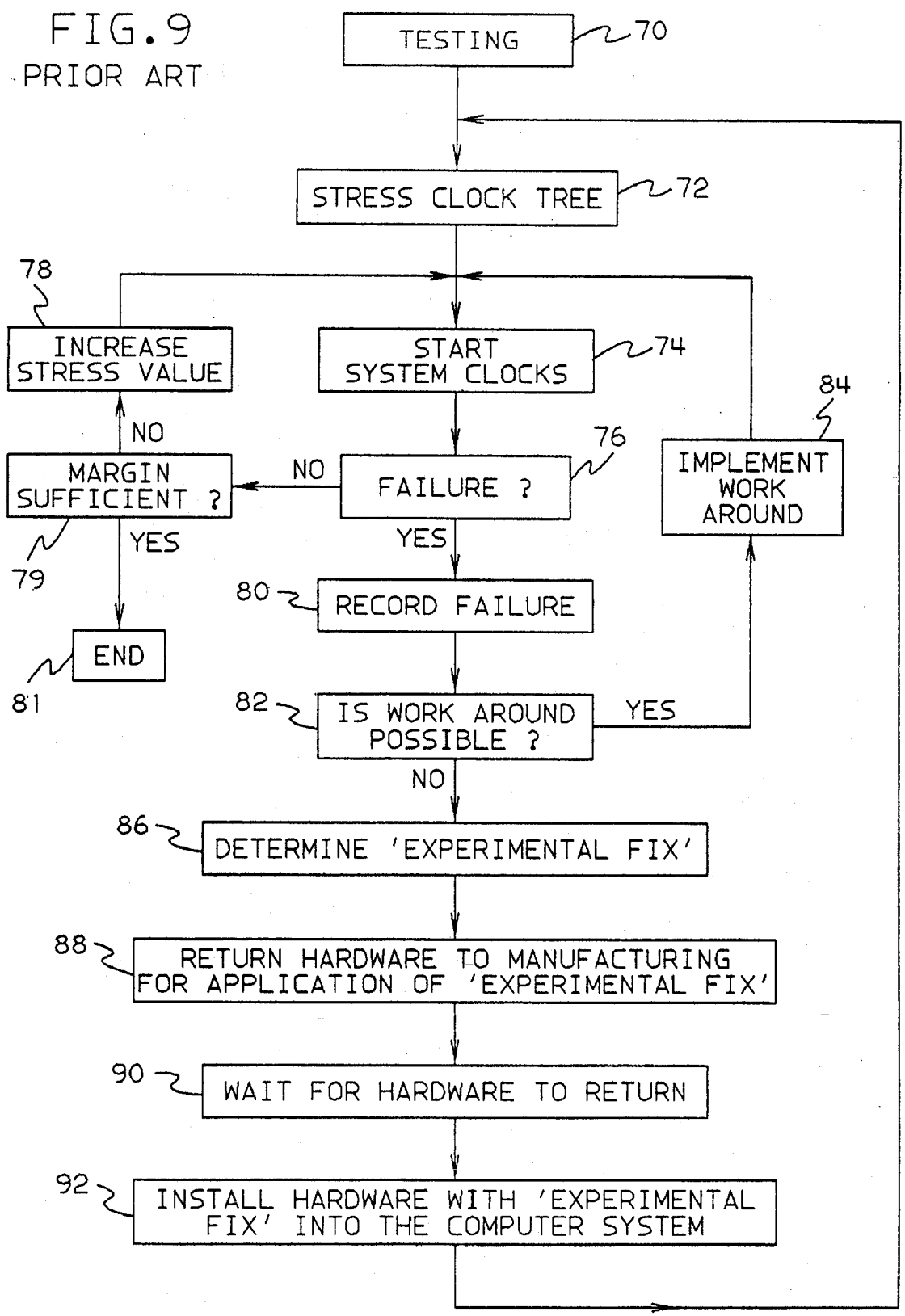
FIG. 9 is a flowchart overview of prior art path stressing.
Figure 10:
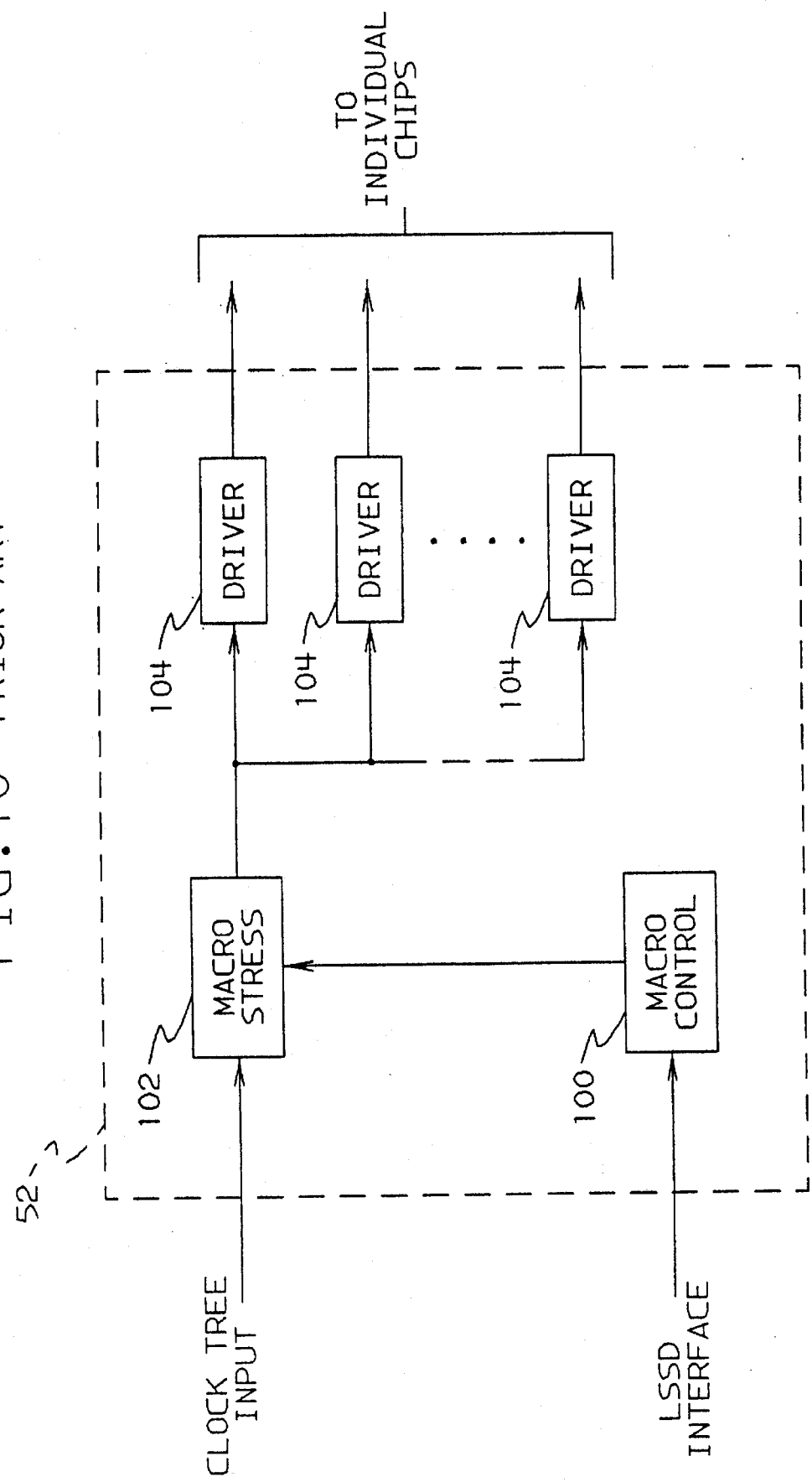
FIG. 10 is an illustration of a "common" path stressing circuit employed by the processing of FIG. 9.

Existing timing analysis can be better understood with reference to the flowchart of FIG. 9 and path stressing circuitry 52 of FIG. 10. By way of example, the processing flow of FIG. 9 assumes "bring-up" of a computer system. Timing analysis and debugging, 70 "Testing," is initiated by "stressing" an entire clock distribution tree (e.g., delaying the phase transitions of all output clock signals) in order to aggravate certain paths having questionable timing margins, 72 "Stress Clock Tree."

As described above, it is less difficult to add clock delay than to subtract clock delay, and the simplest implementation would therefore be to stress the long path limit by adding delay to the trigger clock and to stress the short path limit by adding delay to the latch clock. For a detailed, prior art path stress embodiment reference the incorporated Collins et al. patent.

FIG. 10 depicts one embodiment of path stressing circuitry 52. A macro control 100 controls the application of a "common" stress to the clock tree. The level sensitive logic design interface feeds control registers within macro control 100 for incremental control of the applied stress through an adjustable macro stress circuit 102, which receives as input a clocking signal and outputs an identical, phase delayed clocking signal. This delayed signal is fed in parallel to clock tree drivers 104 whose outputs clock, for example, individual chips connected to the clock distribution and repowering tree.

Continuing with FIG. 9, once a "common" stress is established on the clock tree, computer system clocking is initiated, 74 "Start System Clocks," subsequent to which the checking system determines whether a failure has been forced by the phase shifting of the macro stress, 76 "Failure?". Again, checking systems for detecting and reporting logic path errors are well known. (By way of example, timing failure detecting and reporting systems are provided in IBM's '390 based computer systems.) If no error is detected, then inquiry is made whether the timing margin is sufficient, 79 "Margin Sufficient?" If "yes," processing terminates, 81 "End." Otherwise, the value of the commonly applied stress is increased, 78 "Increase Stress Value," system clocks are restarted, and inquiry is again made whether error has been forced. This process continues until adequate timing margins are verified or timing failure is detected.

After detecting an error, the error is recorded, 80 "Record Failure," and consideration is given to a software "work around," 82 "Is Work Around Possible?" Essentially, this inquiry asks can the failure be isolated or the condition which caused the failure alleviated by a software fix to continue failure analysis? If "yes," the fix is implemented, 384 "Implement Work Around," after which the modified system is retested using the clock stress values which resulted in the recorded failure. Typically, a temporal fix in software is followed by a permanent hardware fix. A hardware fix is a time consuming operation involving modifying computer system structure, e.g., by the deletion, modification or addition of metalization to a chip substrate, in order to improve timing margins.

If no work around is possible, then a potential hardware fix must be identified, 86 "Determine 'Experimental Fix'," for which the hardware must be returned to the manufacturer, 88 "Return Hardware To Manufacturing For Application Of 'Experimental Fix'." After a period of days, 90 "Wait For Hardware To Return," the hardware is returned and reinstalled into the computer system, 92 "Install Hardware With Experimental Fix Into The Computer System." Typically, the time between identifying a possible fix and reinstalling the hardware with the experimental fix incorporated therein consumes a number of days, e.g., five to ten days. This necessarily impinges on the number of possible iterations through the stressing algorithm, and thus on the extent failure "unlayering" can be performed within a reasonable interval of time.

As can be appreciated from the above description, a large number of possibilities exist for timing discrepancies to occur at the system level. System path stressing in accordance with the Collins et al. approach can test for and in some cases eliminate these errors during engineering bring-up or in field diagnostics. Unfortunately, because stressing is "commonly" applied to all clocking signals output from a given clock tree, usefulness of the approach is somewhat limited, often requiring fall back to a more traditional hardware "experimental fix" technique for sequentially addressing timing margin concerns. Further, an operator's ability to position a specific clock to relieve a timing margin concern is restricted to the extent that output clocks on the same clock tree can accept the same stressing without causing failure. In addition, if these work arounds are later replaced by hardware modification, there is no guarantee that other critical paths do not exist for other hardware associated with the same clock tree. This conventionally leads to modification of all chips on the clock tree to avoid the delays associated with unlayering, which is a costly and wasteful process.

In comparison with the above technique, the present invention comprises an enhanced hardware structure, path stressing analysis, and servicing technique (including isolating a failure to a fixable/replaceable logic unit), performable in a matter of minutes, which allows the unlayering of a significantly greater number of timing problems to thereby improve system performance. It is also significant to note that the existing path stressing analysis technique (such as that of FIGS. 8–10) does not guarantee failure isolation, i.e., isolation to a particular chip or major function block on a single chip of the computer system. This is because clock stressing is "commonly" applied to multiple branches of each clock tree. Without guaranteed isolation capabilities, it is obviously more difficult to subsequently implement a hardware modification to relieve a timing margin. Again, the present invention eliminates such prior art processing drawbacks.

Conceptually, the invention includes introducing an individually controlled clock skew to one or more output branches of a clocking tree(s) in a computer system. Introducing a controlled clock skew takes advantage of the fact that an actual hardware implementation often functions differently than predicted using today's analytical models for computer system design. Also, different parts of a system design will often have different timing margins such that timing margin 'criticality' is not the same throughout the computer system. In accordance with the invention, it is recommended that logic be partitioned as follows:

1. All paths with the same source and sink clocks should have a higher design margin, i.e., these paths should be designed as noncritical logic paths.

2. Clocks should be assigned such that devices which capture data from suspected critical paths are controlled independent of devices that launch data to suspected critical paths, especially for single-phase clock systems.

3. Greater early mode timing margin should be designed into clock sections which are suspected to launch or terminate a critical path. This allows for more timing margin transfer between early and late paths in a two-phase clock system.

4. The number of latches per individual clock signal should be reasonable, for example, 100–200 latches per individual clock signal. This, of course, may vary depending on suspected timing path criticality and circuit resource availability.

Figure 11:
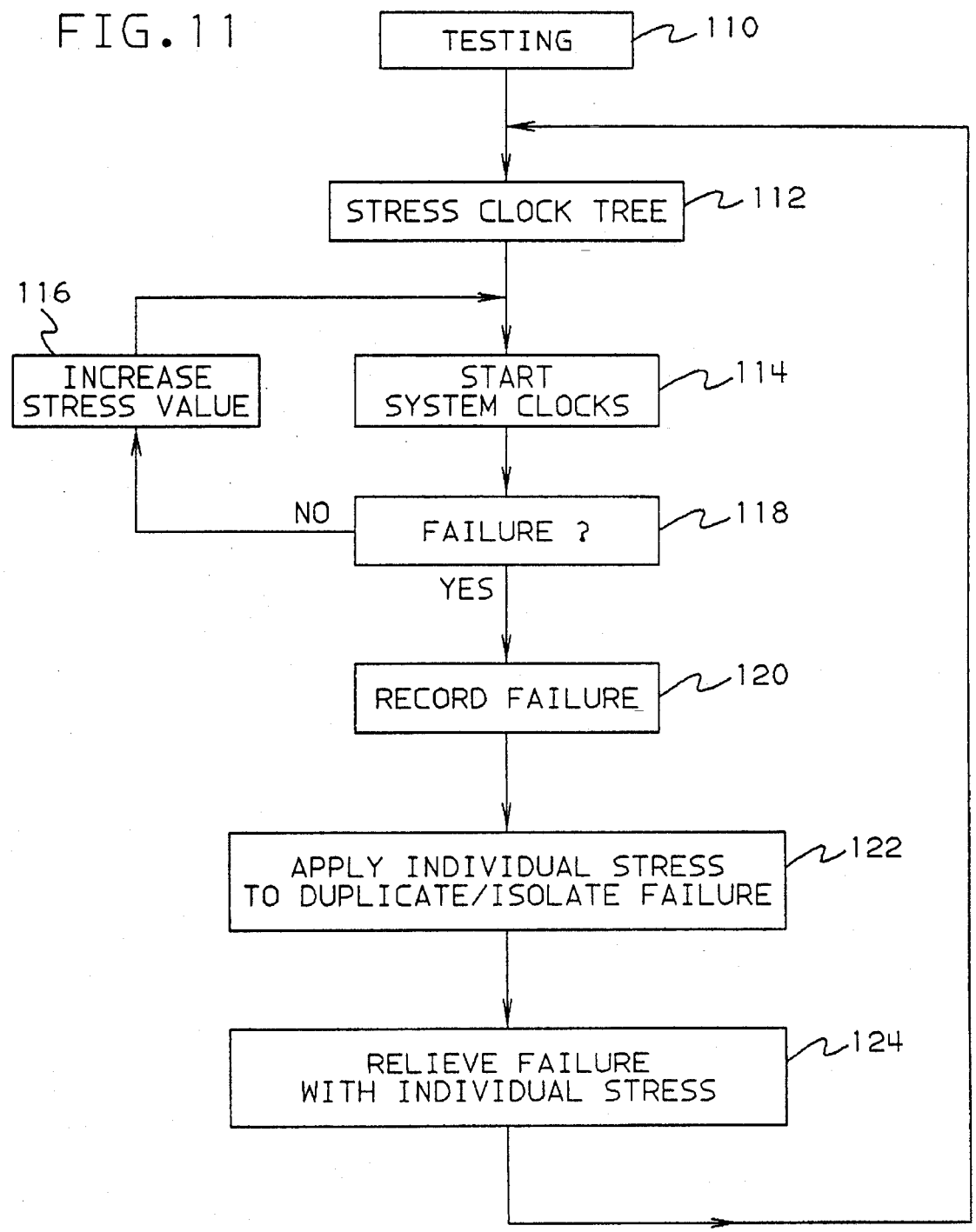
FIG. 11 is a flowchart overview of a path stressing approach in accordance with the present invention.

One high level embodiment of processing in accordance with the invention is set forth in FIG. 11.

Upon initiation of testing, 110 "Testing," a "common stress" is applied to an entire clock tree, 112 "Stress Clock Tree," in a manner similar to the path stressing discussed above with reference to FIGS. 9 & 10. Once a common stress is applied, a clock train is input to the clock tree, 114 "Start System Clock" and failure analysis is conducted, 118 "Failure?" If no failure is detected from the applied common stress, then the clock train is discontinued, the value of the stress is increased, "Increase Stress Value," and the clock train is restarted. This process continues until either adequate timing margins are verified or a failure is detected. Upon detection of a failure, the failure is recorded, 120 "Record Failure."

Path stressing in accordance with the invention departs from the prior approach from this point on in FIG. 11. Timing failure is detected, and ultimately isolated by adjusting the stress (for example, the long path "delay") superimposed onto one or more specific clock chip tree outputs, to thereby increase the clock skew between selected terminals of the clock tree(s), 122 "Apply Individual Stress to Duplicate/Isolate Failure." By increasing clock skew, it is possible to trade-off excess margin in one data path with a "timewise" adjacent data path lacking in timing margin. This timing margin trade-off can be readily implemented during engineering "bring-up" testing, manufacturing testing, or even at a customer's site when necessary. The final step in FIG. 11 is to actually relieve an uncovered timing failure condition by selective enhancing of clock skew among the branches of the clock tree, 124 "Relieve Failure With Individual Stress."

Figure 12:
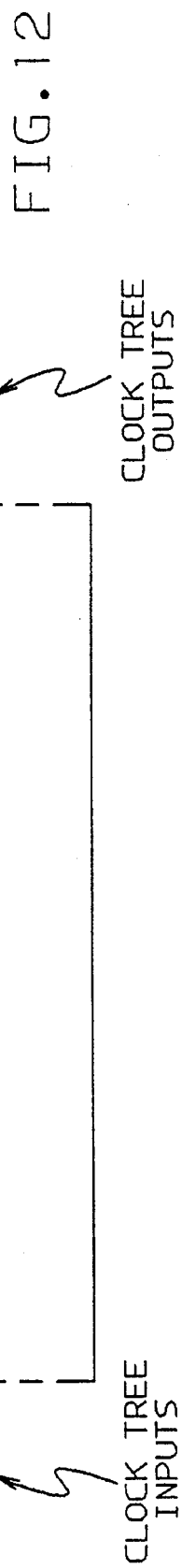
FIG. 12 is an illustration of a path stressing clock chip in accordance with the present invention.
Figure 13:
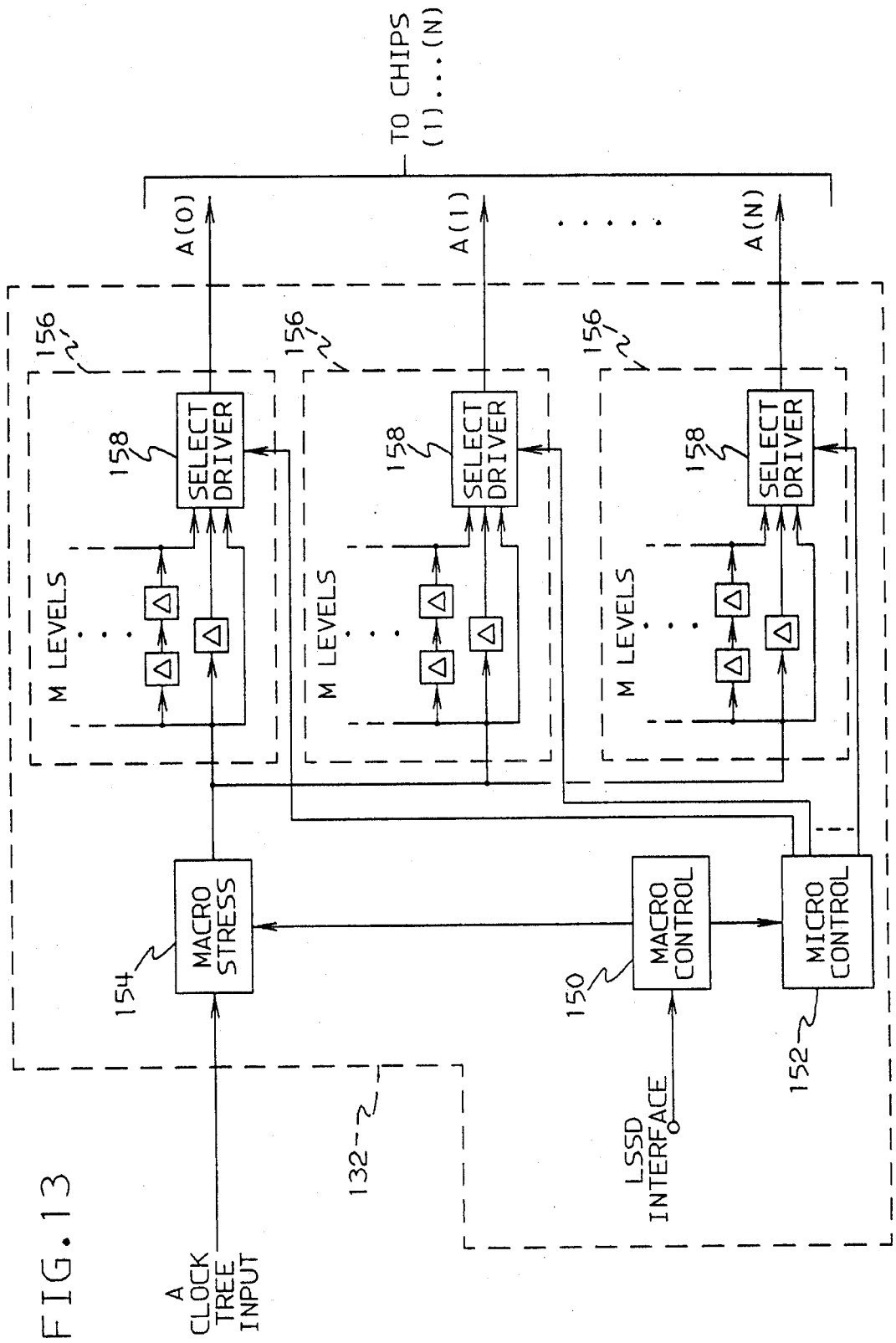
FIG. 13 is an illustration of a path stressing clock tree in accordance with the present invention.

One structure for achieving a desired clock stressing granularity pursuant to the invention is depicted in FIGS. 12 & 13.

FIG. 12 is a high level depiction of a clock chip, denoted 130, having individual stress capabilities applied to the output branches of each clock tree, e.g., clock tree 132. In this simplified embodiment, the output branches comprise a second level branching. As shown, an 'A clock tree input' is fed to the input of a first, "common" stress logic 134, and a 'B clock tree input' is fed to the input of a second, "common" stress logic 136. After branching, the outputs from logic 134 and logic 136 are fed to individual stress logic 138 and 140, respectively. Preferably, logic 138 & 140 are each programmable, and independent of all other clock stressing circuits such that the stress imposed on any given output branch of a clock tree is uniquely controllable relative to the stressing of other output branches of a clock chip.

Output from 'A clock tree' 132 are a plurality of signals A(0) through A(n). In the embodiment depicted, these clocking signals are fed to respective computer chips, chip 1, ..., chip n, 142 within the computer system where they function as trigger clocks or latching clocks. Similarly, clock tree outputs B(0) through B(n) would be fed to respective computer chips, chip 1, ..., chip n. Again, this figure is provided by way of example only. In general, each clock tree output could be fed to the same, different, or multiple semiconductor chips and/or to the same, different, or multiple logic groupings residing on a single chip within the computer system. Preferably, however, each clock feeds only a reasonable number of SRLs so that failure identification can be relatively specific.

FIG. 13 presents a more detailed embodiment of clock tree stressing logic 132. Level Sensitive Scan Design (LSSD) interface signals feed registers in a "common" ("macro") control 150 and an "individual" ("micro") control 152. "Macro" refers herein to a superimposed stress "common" to multiple branches of a clock tree, while "micro" refers to an "individually" applied stress. The terms do not refer to the quantity of stress applied. For example, the delay of a "micro" stress may be equal to or greater than the delay of a "macro" stress. Also, after testing there may be no macro stress applied but only selective micro stressing of certain clock trains which are to remain phase offset relative to one or more clock chip outputs.

The common stress control 150 determines the extent of stressing superimposed on the clock train received at the A clock tree input. Preferably, micro control 152 independently controls micro stress logics 156, each of which is associated with an output branch of the clock tree. Thus, clock skew between the output branches of the clock tree can be easily adjusted by varying the individual path stress of specific clock tree branches. Should a clock tree have more than two branching levels, the concept of "individual" path stressing is equally applicable, i.e., analogous "quasi-micro" control and "quasi-micro" stress logic could be provided for each intermediate level of clock tree branching between input and output levels.

Preferably, each programmable, "individual" stress logic 156 has the capability of stressing the associated tree branch by any one of M delay offsets, with delay offsets each being sequentially offset by (for example) one fixed delay increment 'Δ' relative to adjacent delay offsets. A particular stressing level is repowered through an associated select driver 158, which includes logic circuitry and a multiplexing circuit to allow micro control 152 to select among the M delay offsets. Again, the individual stresses superimposed by micro stress logics 156 on the repowered clock trains provide fine granularity of control over stressing of each clock tree output, and thus, the clock skew between selected clock tree outputs. This control concept extends to the creation of a clock skew between any pair of output clocking trains, whether from the same clock tree or different clock trees of the system's clock chip.

As mentioned above, the "individual" stress circuits serve two functions. The first function is to facilitate testing of timing margins within the computer system, while the second function is dynamically alleviate (i.e., isolate) one or more uncovered timing problems, thus facilitating "unlayering" of multiple timing problems. The first function is introduced above, while the second function is discussed further below.

Figure 14:
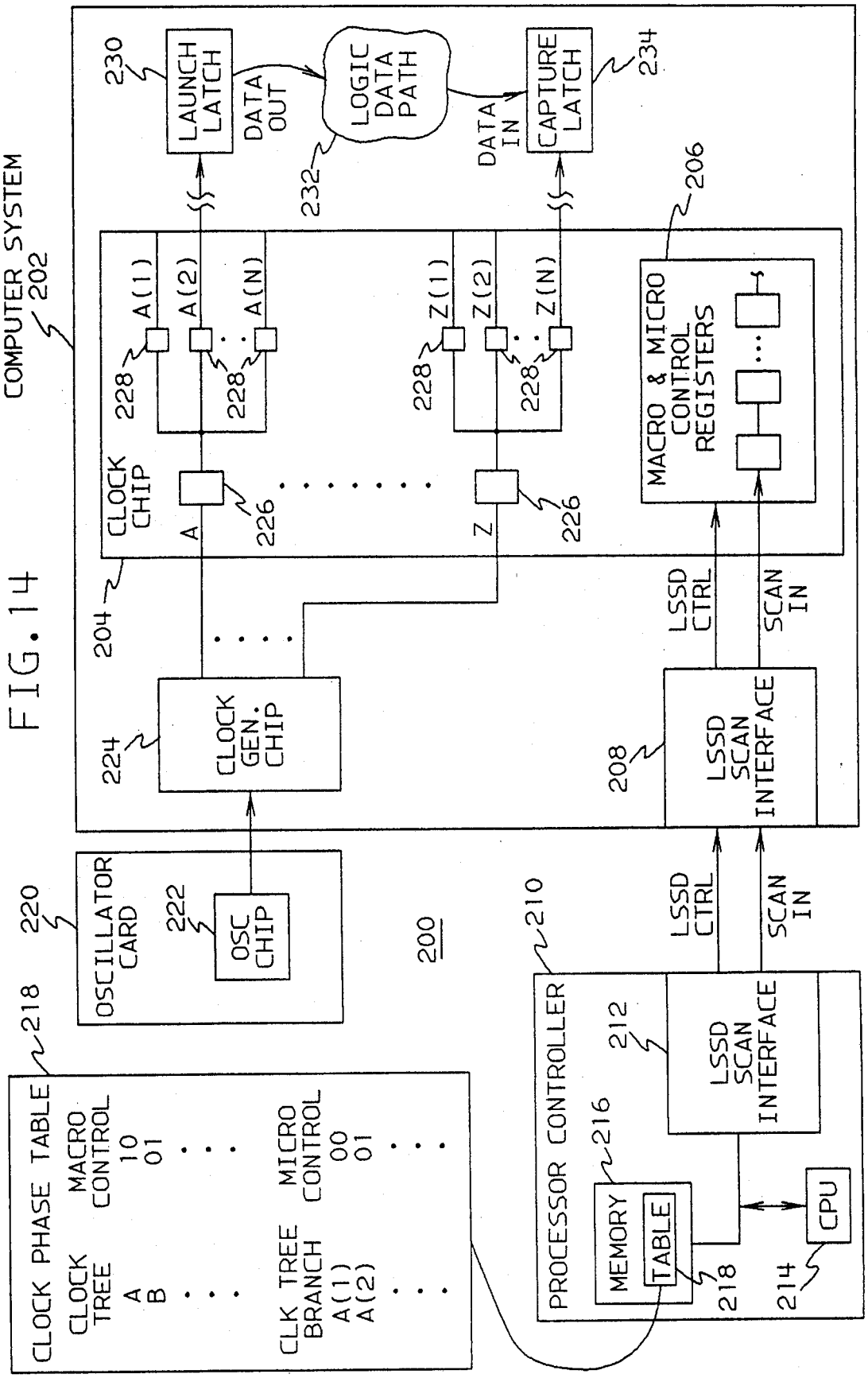
FIG. 14 is an illustration of a computer system and processor controller implementing path stressing in accordance with the present invention.

First, however, a detailed embodiment of a computer system pursuant to the invention is presented. In FIG. 14 a support system 200 for a main frame computer system 202 is shown configured for timing failure diagnostics and unlayering processing. The circuitry of FIGS. 12 & 13 is assumed to reside on one or more computer chips 204 disposed within computer system 202. Appropriate control signals are received at computer chip 204 in macro and micro control registers 206 which are connected to an LSSD scan interface 208, which comprises one portion of the LSSD interface between computer system 202 and a processor controller 210.

Controller 210 includes an LSSD scan interface 212 which transmits "LSSD CTRL" and "SCAN IN" signals to LSSD scan interface 208 within computer system 202 for forwarding to macro and micro control registers 206 disposed on clock chip 204. Processor controller 210 also includes a CPU 214 and memory 216 within which a "design data" table 218 resides having clock phase information for both macro and micro control registers. In one example, the design information contained within table 218 is assumed to have been empirically generated using the specific computer system with which the support system is associated. The clock phase table also includes clock stress override control signals for each macro stress and micro stress block of the clock chip.

Operationally, in this one embodiment an oscillator card 220 having an oscillator chip 222 generates an oscillating signal which is fed to a clock generation chip 224 (within computer system 202) that generates a plurality of clocking trains. Each clocking train input (A . . . Z) can be fed to a single clock tree or to multiple clock trees simultaneously. As described above, each input signal is initially fed through a corresponding common ("macro") stress logic 226 on the respective clock tree. Each macro stress logic 226 is preferably incrementally adjustable via the signals placed in macro control registers 206 by process controller 210. After branching within the respective clock tree, each signal undergoes individual ("micro") stressing via logic 228. The amount of individual delay assigned to each micro stress logic 228 is controlled by micro control registers 206, and hence processor controller 210.

By way of example, an A(2) output branch of clock tree A is selected to provide a trigger clock to a launch latch 230 located on a chip within computer system 202. Upon receipt of the trigger clock, launch latch 230 transmits stored DATA OUT. This DATA OUT is fed through a logic data path 232 and eventually received as DATA IN at a capture latch 234. A latch or "capture" clock, taken from output branch Z(n) of a clock chip 204, controls DATA IN capturing by latch 234. The trigger clock and the launch clock can be provided by the same clock chip (as in FIG. 14), or by different clock chips. Specific, single-phase and dual-phase launch and capture timing examples in accordance with the present invention are provided below. First, however, the flowcharts of FIGS. 15a-17e (depicting detailed path stressing embodiments pursuant to the present invention) are discussed.

Figure 15A:
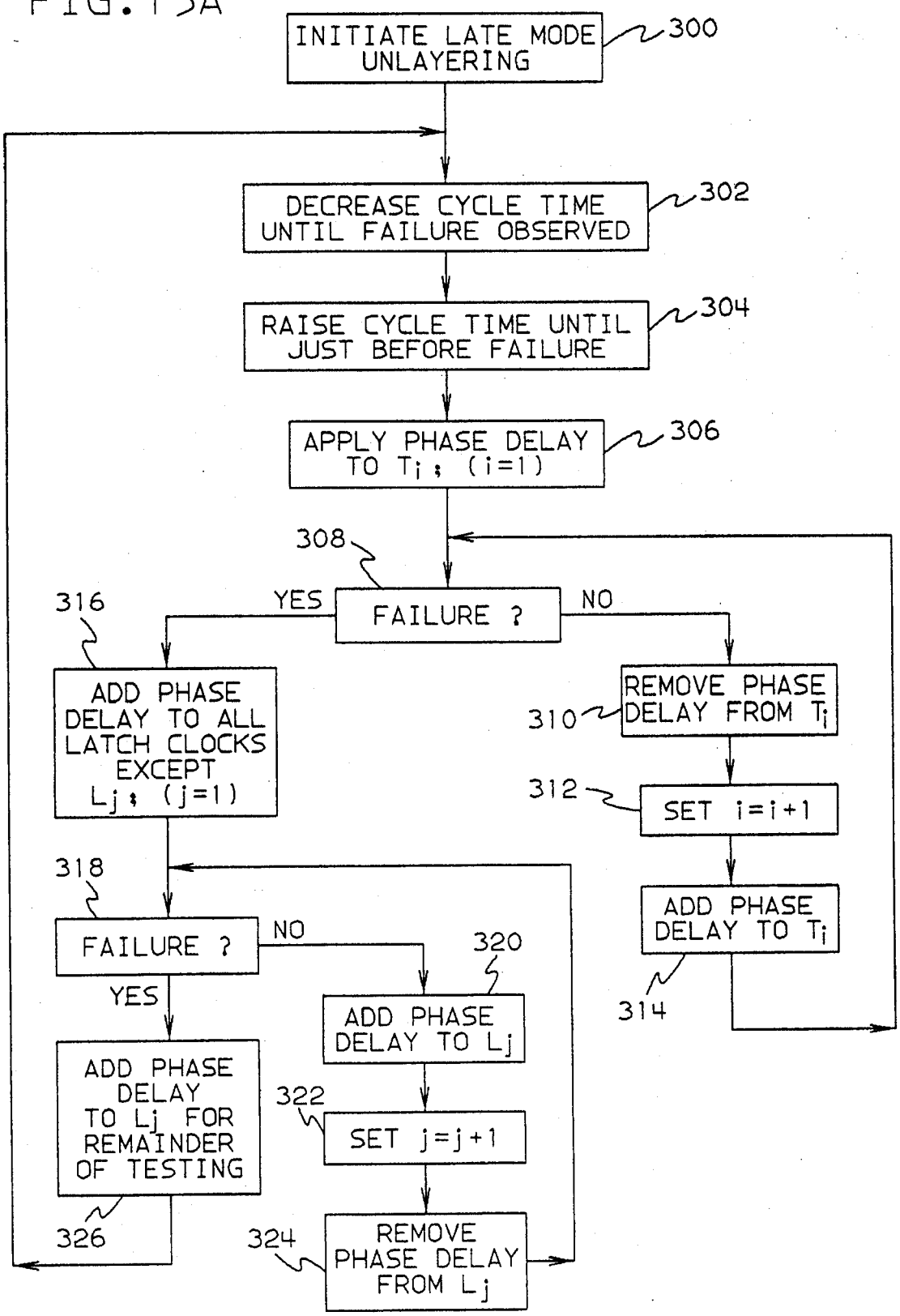
FIGS. 15a & 15b are flowcharts of late mode timing analysis and early mode timing analysis, respectively, in accordance with the present invention.
Figure 15B:
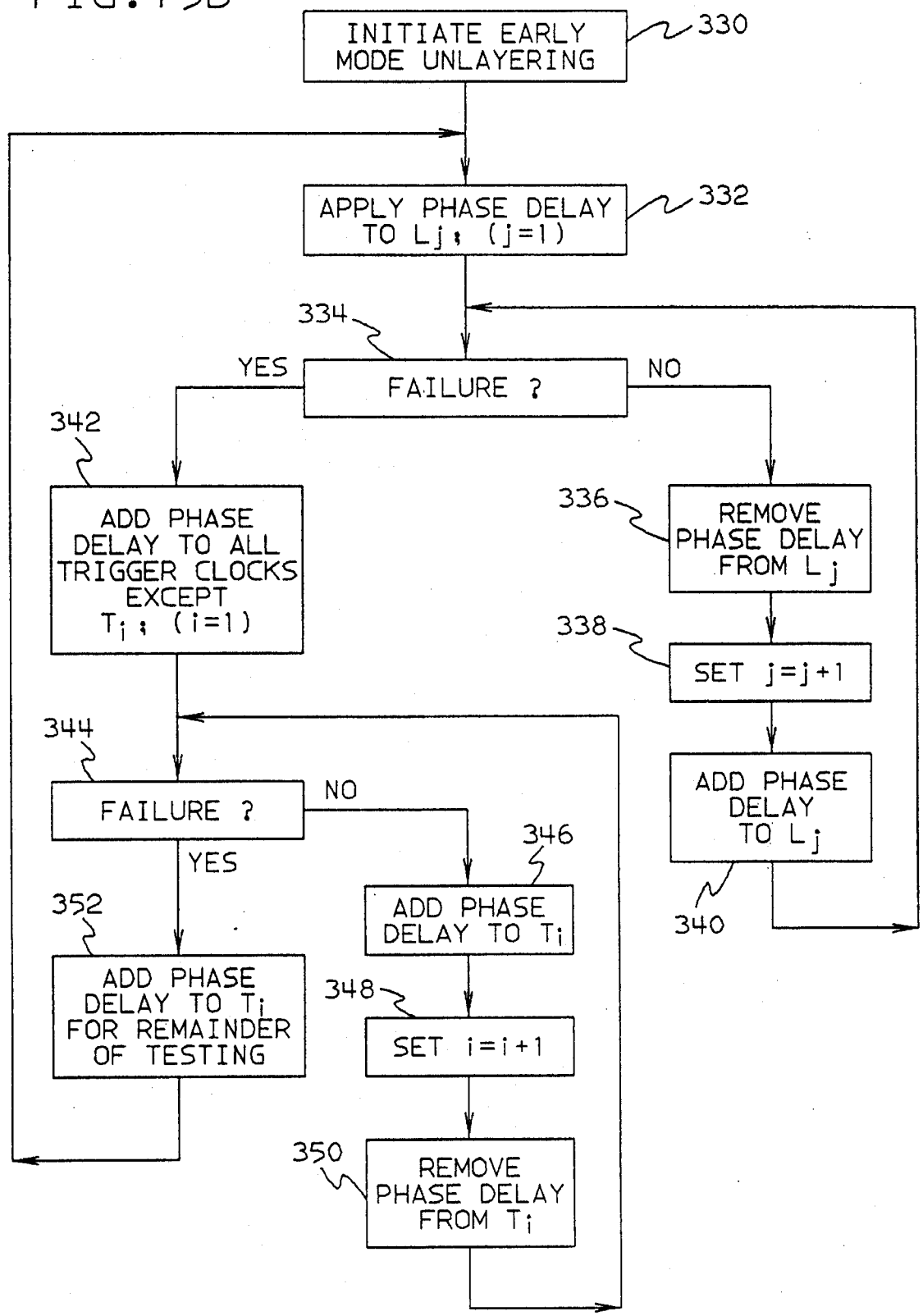

FIGS. 15a & 15b illustrate long path processing and short path processing approaches, respectively. The goal of this timing analysis is to diagnose a path of inadequate timing margin from source clock to sink clock. This includes isolation of a failure to a failing component, as well as identifying a work around to eliminate said failure. For both the application of delay to a trigger clock and removal of delay from a latch clock, standard binary search techniques could be used to speed up processing. Also, it is assumed that the addition of phase delay to trigger clocks and latch clocks proceeds incrementally, with the phase delay increments being substantially equal.

Beginning with FIG. 15a, an automated approach to identifying questionable long path timing margins is first discussed. This late mode timing unlayering approach includes initially decreasing cycle time to quickly aggravate paths having questionable timing margin. This method will also unlayer cycle independent late mode failures. In particular, upon starting processing, 300 "Initiate Late Mode Unlayering," the cycle time is decreased until a timing failure is observed, 302 "Decrease Cycle Time Until Failure Observed." After obtaining a failure based on this coarse "cycle time" adjustment, the technique is to back off from cycle time stressing and to delay trigger clocks one at a time until the failure is recreated. Thus, the processing flow includes 304 "Raise Cycle Time Until Just Before Failure," and 306 "Apply Phase Delay To $T_i$; (i=1)." In this embodiment, $T_1$ is assumed to comprise a first trigger clock output from the clock chip. (Preferably, there is sufficient granularity in design so that the checking system can identify a smallest replaceable unit (for example, a chip) which is failing.)

With trigger clock $T_i$ phase delayed, failure analysis is conducted, 308 "Failure?" If no failure is detected, then the extra phase delay superimposed on trigger clock $T_i$ is removed, 310 "Remove Phase Delay From $T_i$," a next trigger clock is selected, 312 "Set i=i+1," and the extra phase delay is superimposed onto the new trigger clock signal $T_i$, 314 "Add Phase Delay To $T_i$." The system is then reexamined for timing failure (inquiry 308). This sequential consideration of trigger clocks continues until a failure occurring with the coarse cycle time adjustment is recreated. Once failure is recreated, thereby identifying a particular trigger clock associated with the failed path, analogous processing is conducted for each latch clock, 316 "Add Phase Delay To All Latch Clks. Except $L_j$; (j=1)." Processing considers whether a failure is detected, 318 "Failure?"

If "no," then the phase delay increment is added to latch clock $L_j$, 320 "Add Phase Delay To $L_j$," a new latch clock is selected 322 "Set j=j+1," and the incremental phase delay is removed from this new latch clock, 324 "Remove Phase Delay From $L_j$." With the new latch clock selected, consideration is again given to whether failure is detected, 318 "Failure?" Processing continues in this loop until the failure is recreated. Once identified, the latch clock associated with the failure is recorded and the incremental phase delay is superimposed on the recorded latch clock for the remainder of the testing, 326 "Add Phase Delay To $L_j$ For Remainder Of Testing." The addition of incremental phase delay to the recorded latch clock $L_j$ ensures that this particular latch clock will not recreate a failure condition. Once a trigger clock and latch clock pair have been identified, processing loops back (instruction 302) for further long path timing margin analysis. Thus, the discovered trigger clock/latch clock pair is "unlayered" from other possible timing margin failures.

One embodiment of short path processing in accordance with the present invention is depicted in FIG. 15b. This processing routine is similar to the late mode processing of FIG. 15a, except short path failure analysis is independent of cycle time variations. Thus, there is no need to increase/decrease the cycle time. Also, references to latch clocks and trigger clocks are reversed.

Early mode timing failure analysis is initiated, 330 "Initiate Early Mode Unlayering," by applying an incremental phase delay to a selected latch clock $L_j$, 332 "Apply Phase Delay To Latch Clock $L_j$; (j=1)." For convenience, the first latch clock $L_1$ output from the clock chip is initially selected. However, the order in which the latch clocks are considered can be arbitrary. The possible occurrence of failure is then checked, 334 "Failure?" If no failure occurs with the initially selected latch clock stressed, then the delay is removed from this latch clock, 336 "Remove Delay From $L_j$," a new latch clock is selected, 338 "Set j=j+1," and the same incremental delay is added to this new latch clock, 340 "Add Phase Delay To L$_j$."

Once failure is detected, analysis is undertaken to identify a trigger clock paired with a questionable latch clock. This involves delaying all trigger clocks, except one and sequentially removing the delay from one trigger clock at a time until timing failure reoccurs. Thus, upon detecting a failed latch clock, all trigger clocks receive an incremental phase delay except trigger clock T$_i$, 342 "Add Phase Delay To All Trigger Clocks Except T$_i$; (i=1)." If no failure is detected, 344 "Failure?", then the phase delay is added to trigger clock T$_i$, 346 "Add Phase Delay to T$_i$," a new trigger clock is selected, 348 "Set i=i+1," and the incremental delay is removed from this new trigger clock T$_i$, 350 "Remove Phase Delay From T$_i$." Once failure reoccurs, the latch clock and trigger clock pair comprising the capture and launch clocks, respectively, for the failing short path have been identified. The incremental phase delay is added to the identified trigger clock T$_i$, 352 "Add Phase Delay To T$_i$ For Remainder Of Testing," and processing returns to instruction 332 for examination of a next possible timing margin failure. Thus, "unlayering" of short mode failures is achieved.

When automated, processing in accordance with the flowcharts of FIGS. 15a & 15b significantly reduces the time required to diagnose system timing failures. By achieving reduced analysis time, it is possible to deliver a faster computer system and it is possible to deliver the computer system more quickly to market.

More detailed processing embodiments in accordance with the present invention are next discussed with reference to the late mode processing of FIGS. 16–16f and the early mode processing of FIGS. 17–17e.

Figure 16:
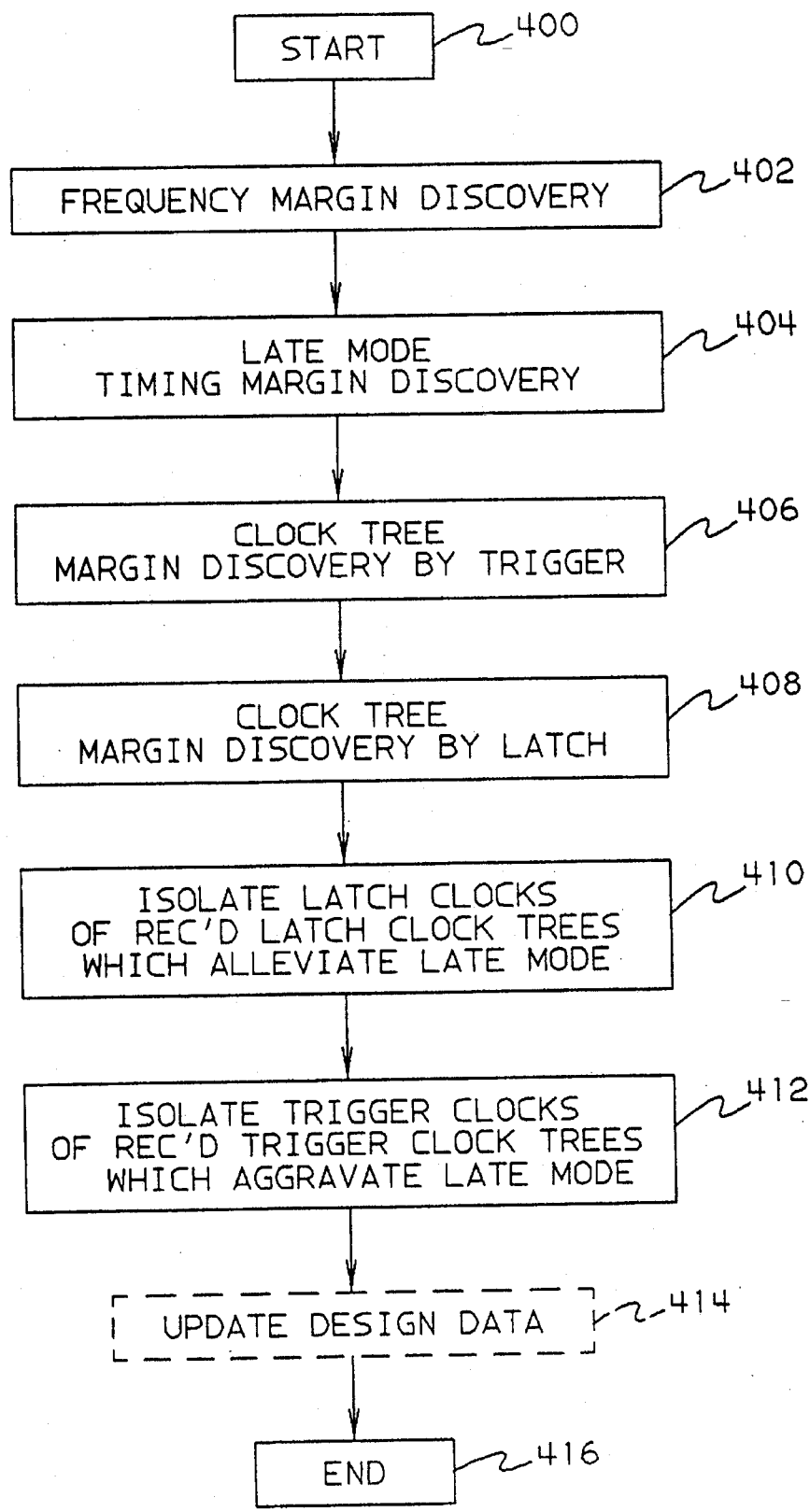
FIG. 16 is a flowchart overview of another embodiment of late mode path stressing in accordance with the present invention.
Figure 16A:
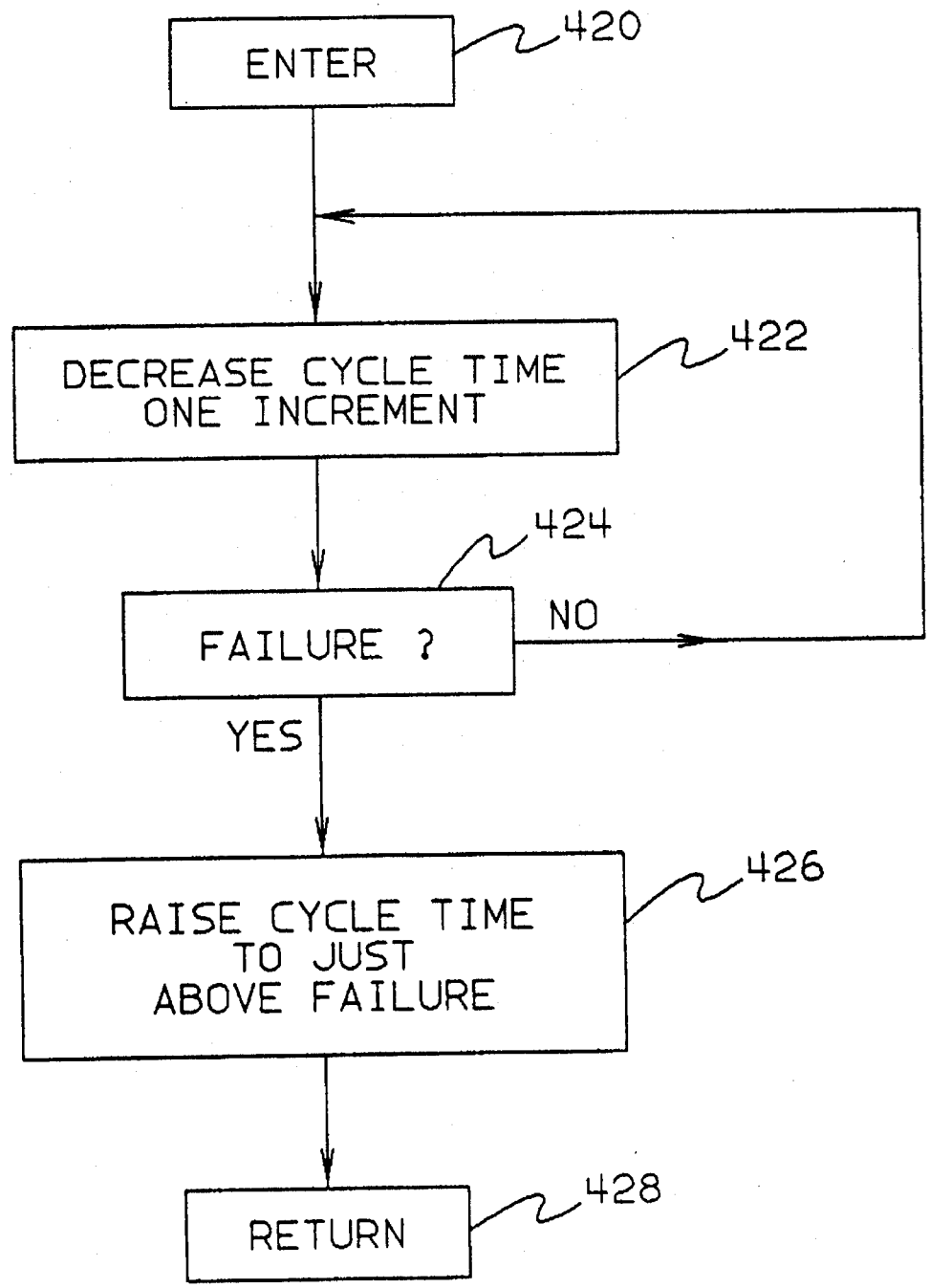
FIG. 16a is a flowchart of one embodiment for frequency margin discovery for the timing analysis processing of FIG. 16.

An overview of one late mode clock tuning embodiment is depicted in FIG. 16. Upon initiating late mode processing, 400 "Start," existing frequency margins are discovered, 402 "Frequency Margin Discovery" (FIG. 16a). Then, timing margins are aggravated, 404 "Late Mode Timing Margin Discovery" (FIG. 16b), and a failing clock trigger tree(s) is(are) identified, 406 "Clock Tree Margin Discovery By Trigger" (FIG. 16c). Next, corresponding failing latch clock tree(s) is(are) discovered, 408 "Clock Tree Margin Discovery By Latch" (FIG. 16d). Thereafter, the alleviating latch clocks in the isolated latch clock tree(s) are identified, 410 "Isolate Latch Clks. Of Rec'd Latch Clk. Trees Which Alleviate Late Mode" (FIG. 16e), and the aggravating trigger clocks in the aggravating trigger clock trees are located, 412 "Isolate Trigger Clks. Of Rec'd Trigger Clk. Trees Which Aggravate Late Mode" (FIG. 16f). Once the source-sink failure clocks are identified, design data may be updated. Obviously, this depends upon the purpose of timing margin testing, 414 "Update Design Data." Alternatively, identified alleviating latch clocks may be employed as permanent software fixes to questionable timing margin, after which late mode processing is terminated, 416 "End." FIGS. 16a–16f are each discussed separately below.

Referring to FIG. 16a, clock tuning begins, 420 "Enter," with a cycling down of the computer system from the design data points 422 "Decrease Cycle Time One Increment," until failure occurs, 424 "Failure?" Once a failing condition is identified, the cycle time is raised to just above the failing frequency, 426 "Raise Cycle Time To Just Above Failure." Return is then made to the processing of FIG. 16 at point of call, 428 "Return."

Figure 16B:
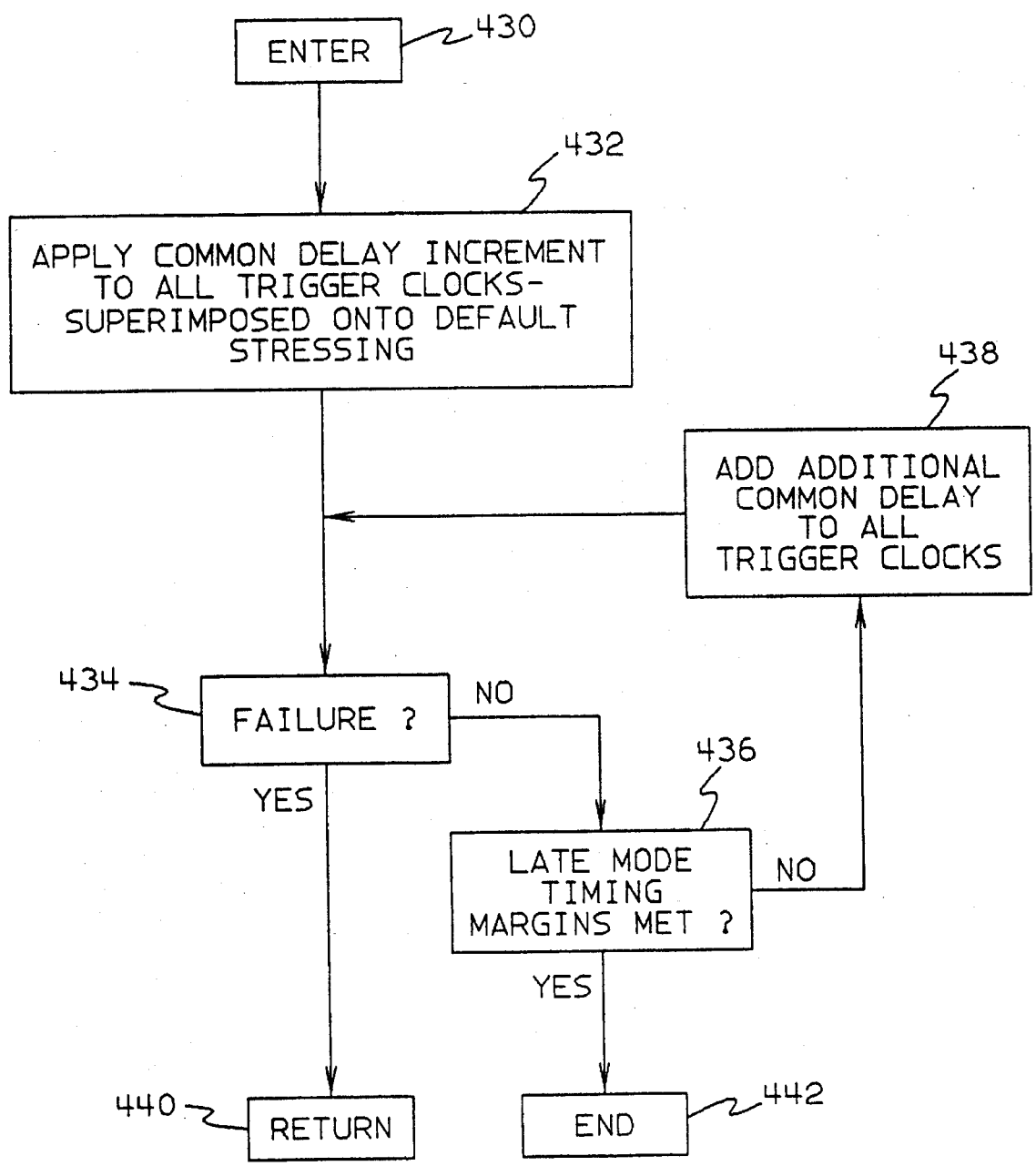
FIG. 16b is a flowchart of one embodiment for late mode timing margin discovery for the timing analysis processing of FIG. 16.
Figure 16D:
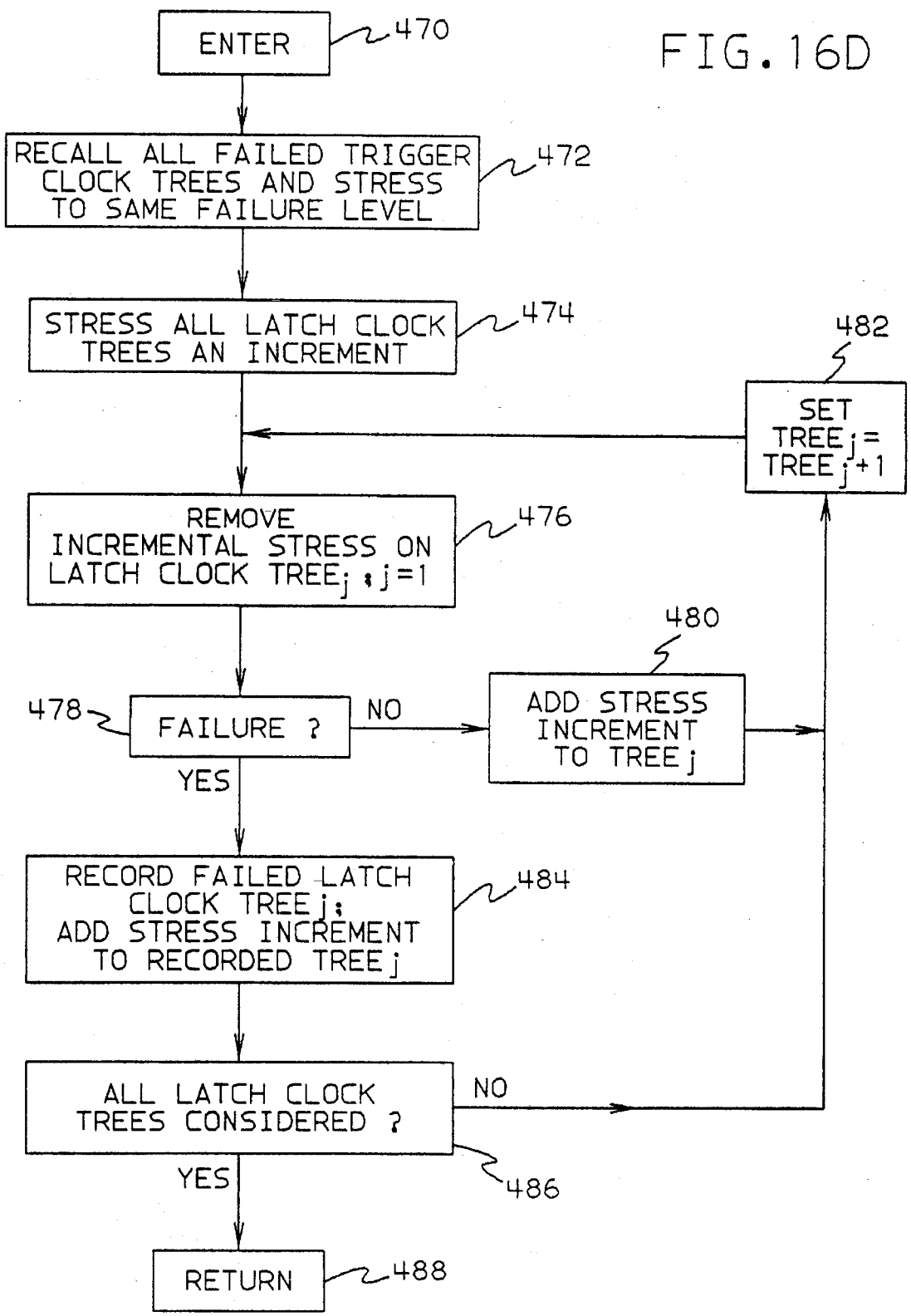
FIG. 16d is a flowchart of one embodiment for latch clock tree margin discovery for the timing analysis processing of FIG. 16.

Once frequency margins are discovered, late mode margin discovery processing of FIG. 16b is commenced, 430 "Enter." Initially, a common delay increment is applied to all trigger clocks in the machine, 432 "Apply Common Delay Increment To All Trigger Clks.—Superimposed Onto Default Stressing," subsequent to which failure analysis is conducted, 434 "Failure?" This processing attempts to duplicate a failure condition initially created by the cycling down of FIG. 16a. If no failure occurs, then inquiry is made into whether the late mode timing margins have been met, 436 "Late Mode Timing Margins Met?" If "no," then additional common delay is added to all trigger clocks, 438 "Add Additional Common Delay To All Trigger Clocks" and failure analysis again occurs. Once failure is detected, processing returns to the main flow of FIG. 16, 440 "Return." If late timing margins are met, then processing is discontinued and clock tuning is completed for late mode, 442 "End."

Once late mode timing margin failure is discovered, then the processing of FIG. 16c occurs to identify particular trigger clock trees which source the failure(s). Upon initiating trigger clock tree analysis, 450 "Enter," the incremental common delay superimposed on the clocks by the processing of FIG. 16b is removed, 452 "Remove Common Delay Increment Superimposed Onto All Trigger Clocks," and a "common" delay increment is applied to a single trigger clock tree, 454 "Apply Common Delay Increment To Trigger Clk. Tree$_i$; (i=1)." With the common delay increment applied to only one trigger clock tree, failure analysis is conducted, 456 "Failure?" If no failure occurs, then the common delay increment is removed from Tree$_i$, 457 "Remove Common Delay Increment From Tree$_i$," and a new trigger clock tree is selected, 458 "Set Tree$_i$=Tree$_i$+1."

After a new trigger clock tree is selected, the common delay increment is applied to this new clock tree (instruction 454). The process repeats until a trigger clock tree is identified as initiating a timing failure, whereupon the failing trigger clock tree is recorded and the common delay increment is removed from the tree, 460 "Record Failed Tree$_i$; Remove Common Delay Increment From Tree$_i$." If all trigger clock trees have not been considered, 462 "All Trigger Clk Trees Considered?" processing continues; otherwise return, 464 "Return," is made to the point of call (FIG. 16).

Once the aggravating trigger clock trees are identified, the alleviating latch clock trees can be discovered via the processing of FIG. 16d. Processing begins, 470 "Enter," with the recall of all trigger clock trees, which are then stressed to the same failure level, 472 "Recall All Failed Trigger Clock Trees and Stress To The Same Failure Level." Once the stress is applied to all failing trigger clock trees, all latch clock trees are sequentially stressed an increment to alleviate the failure condition, 474 "Stress All Latch Clock Trees An Increment." The incremental stressing on a latch clock tree is removed, 476 "Remove Incremental Stress On Latch Clk. Tree$_j$; j=1," which is followed by timing failure analysis, 478 "Failure?" This processing continues until all alleviating latch clock trees associated with the aggravating trigger clock trees are identified. In particular, the removed incremental stress is re-applied to latch clock Tree$_j$, 480 "Add Stress Increment To Tree$_j$," which is followed by selection of a new latch clock tree, 482 "Set Tree$_j$=Tree$_j$+1." With selection of a new latch clock tree, the incremental stress is removed therefrom and failure analysis is again conducted. Once a failing latch clock tree is identified, the tree is recorded and the incremental stress is re-applied, 482 "Record Failed Latch Clk. Tree$_j$; Add Stress Increment To Recorded Tree$_j$." A final processing inquiry determines whether all latch clock trees have been considered, 486 "All Latch Clk. Trees Considered?" If "no," processing continues; otherwise, return is made to point of call, 488 "Return" (FIG. 16).

Figure 16E:
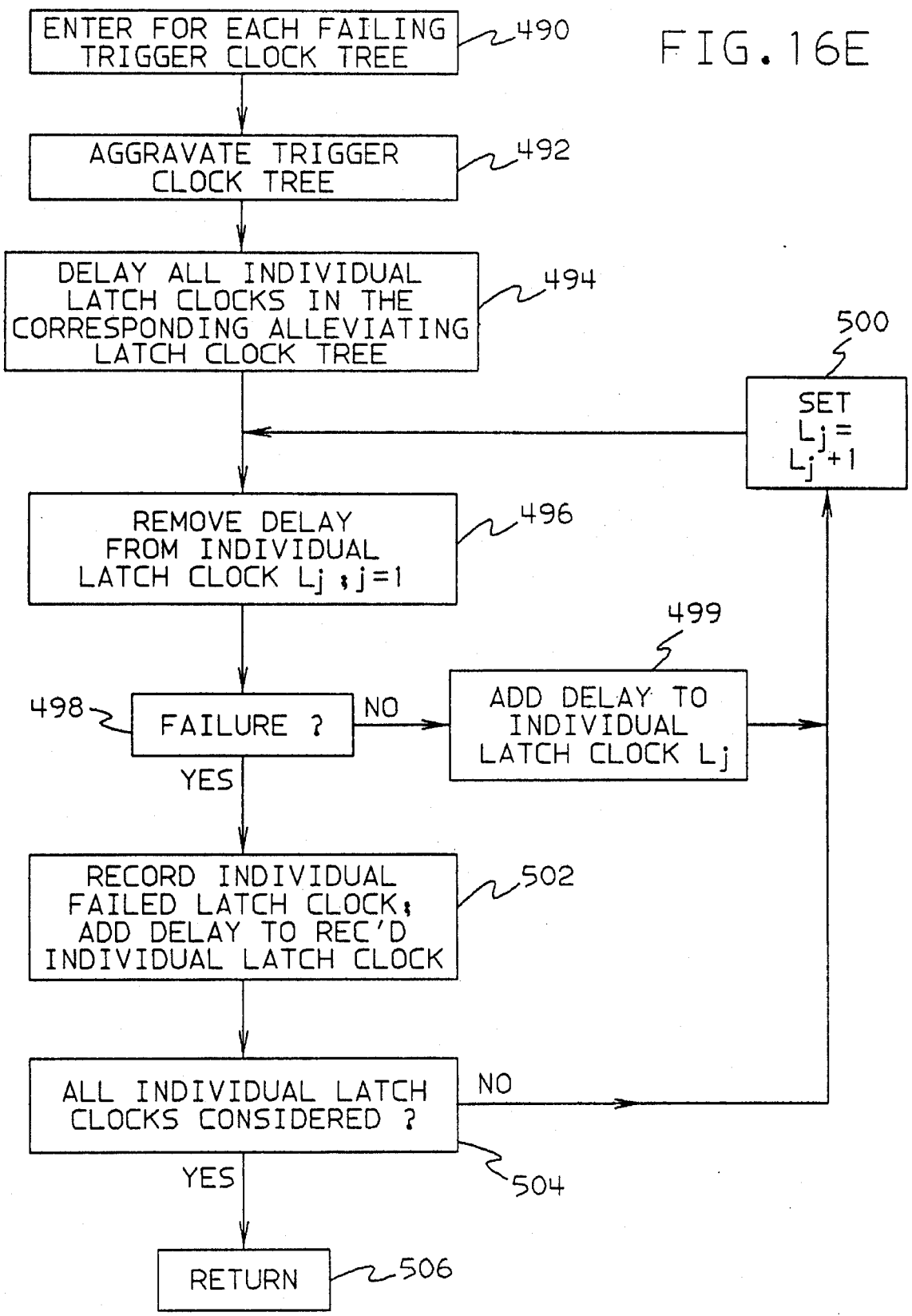
FIG. 16e is a flowchart of one embodiment for isolating individual latch clocks from isolated alleviating latch clock trees of FIG. 16d.
Figure 16F:
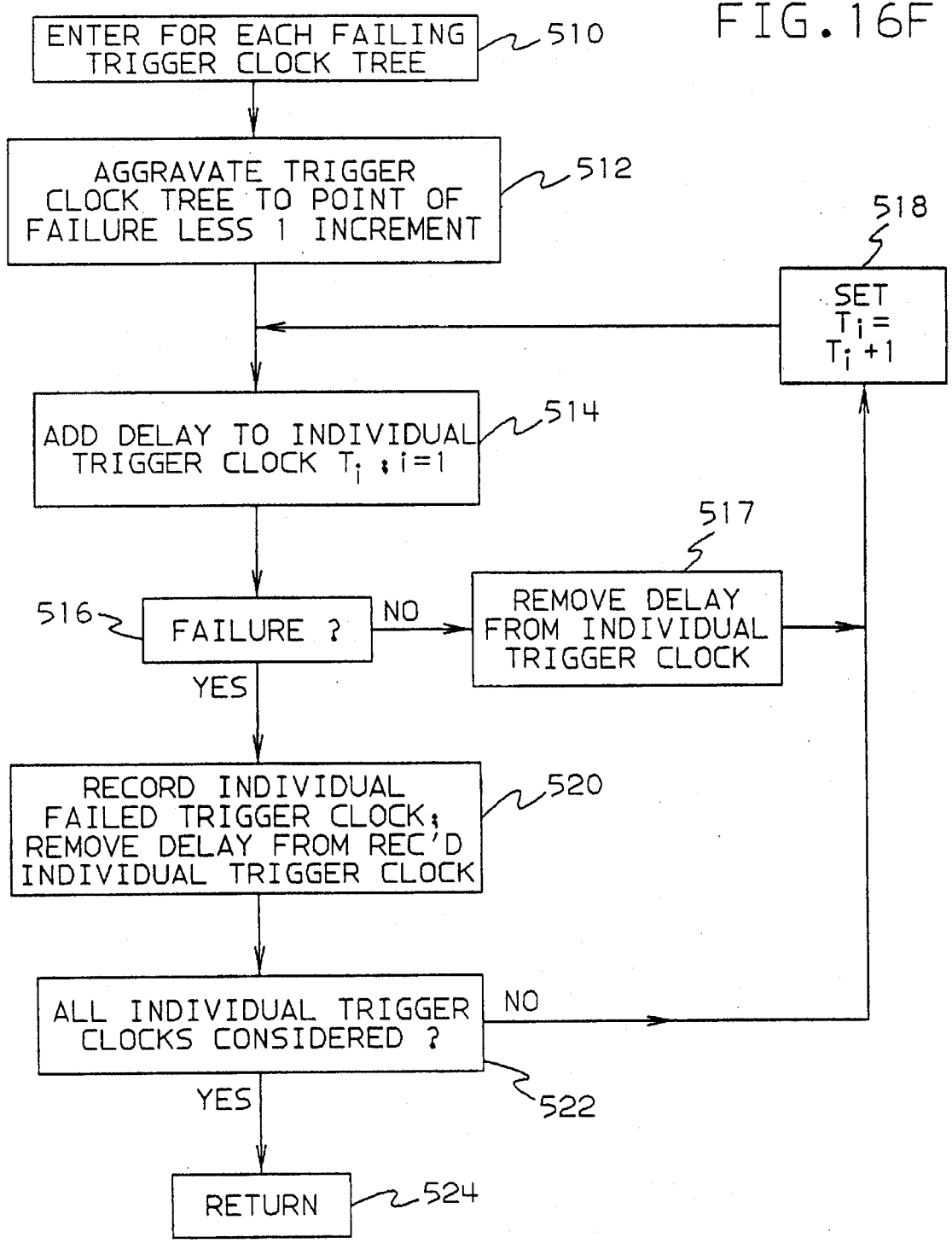
FIG. 16f is a flowchart of one embodiment for isolating individual trigger clocks from isolated aggravating trigger clock trees of FIG. 16c.

Next, the specific latch clocks on the isolated latch clock trees which alleviate failure conditions are identified. These latch clocks present one "work around" option for mitigating questionable timing margins. Referring to FIG. 16e, for each failing trigger clock tree, 490 "Enter For Each Failing Trigger Clk. Tree," the trigger clock tree is stressed to its failing condition, 492 "Aggravate Trigger Clock Tree." Thereafter, all latch clocks in the paired alleviating latch clock tree are delayed, 494 "Delay All Individual Latch Clocks In The Corresponding Alleviating Latch Clk. Tree." The alleviating latch clocks are then considered one at a time, 496 "Remove Delay From Individual Latch Clk. $L_j$; j=1." If no failure occurs, 498 "Failure?" then the delay is added to the selected individual latch clock $L_j$, 499 "Add Delay To Ind. Latch Clk. $L_j$," and a next latch clock is selected, 500 "Set $L_j=L_j+1$," after which processing returns to instruction 496.

Once a failed latch clock is identified, the failure is recorded and the micro stress is reapplied to the recorded latch clock, 502 "Record Ind. Failed Latch Clk.; Add Delay To Rec'd Ind. Latch Clk." Thereafter, processing determines whether all latch clocks in the latch clock tree have been considered, 504 "All Ind. Latch Clks. Considered?" If "no," processing continues by selecting a next latch clock in the tree. Otherwise, all latch clocks in the tree have been identified and return is made to the point of call, 506 "Return" (FIG. 16).

For completeness, it may also be desirable to determine which trigger clocks in the trigger clock trees initiate a failure condition. FIG. 16f presents one processing method for accomplishing this objective. The processing is conducted for each failing trigger clock tree, 510 "Enter For Each Failing Trigger Clock Tree." Initially the trigger clock tree is aggravated to a point of near failure by stressing, less one delay increment, 512 "Aggravate Trigger Clk. Tree To Pt. Of Failure Less One Increment," after which delay is individually added to one of the trigger clocks $T_i$, 514 "Add Delay To Ind. Trigger Clk. $T_i$; i=1." Processing considers whether a failure has occurred, 516 "Failure?"

If "no," then the delay is removed from the selected individual trigger clock, 517 "Remove Delay From Ind Trigger Clk.," a next trigger clock in the trigger clock tree is selected, 518 "Set $T_i=T_i+1$," and return is made to instruction 514. Processing continues in this loop until a failure is identified, at which point the individual trigger clock is recorded and delay is removed from the failed trigger clock, 520 "Record Ind. Failed Trigger Clk.; Remove Delay From Rec'd Ind. Trigger Clk." Processing then considers whether all individual trigger clocks in the failed trigger clock tree have been considered, 522 "All Ind. Trigger Clks. Considered?" If "no," then a next trigger clock is selected (instruction 518). Otherwise, return is made to point of call, 524 "Return" (FIG. 16).

Those skilled in the art will note that the order of processing presented above is somewhat arbitrary. Further, if only alleviating latch clocks are desired, then it is possible to omit isolation of individual trigger clocks. However, because there is an interdependence between late mode and early mode timing functions, it is believed preferable to identify for completeness the particular trigger clocks initiating late mode failures.

Figure 17:
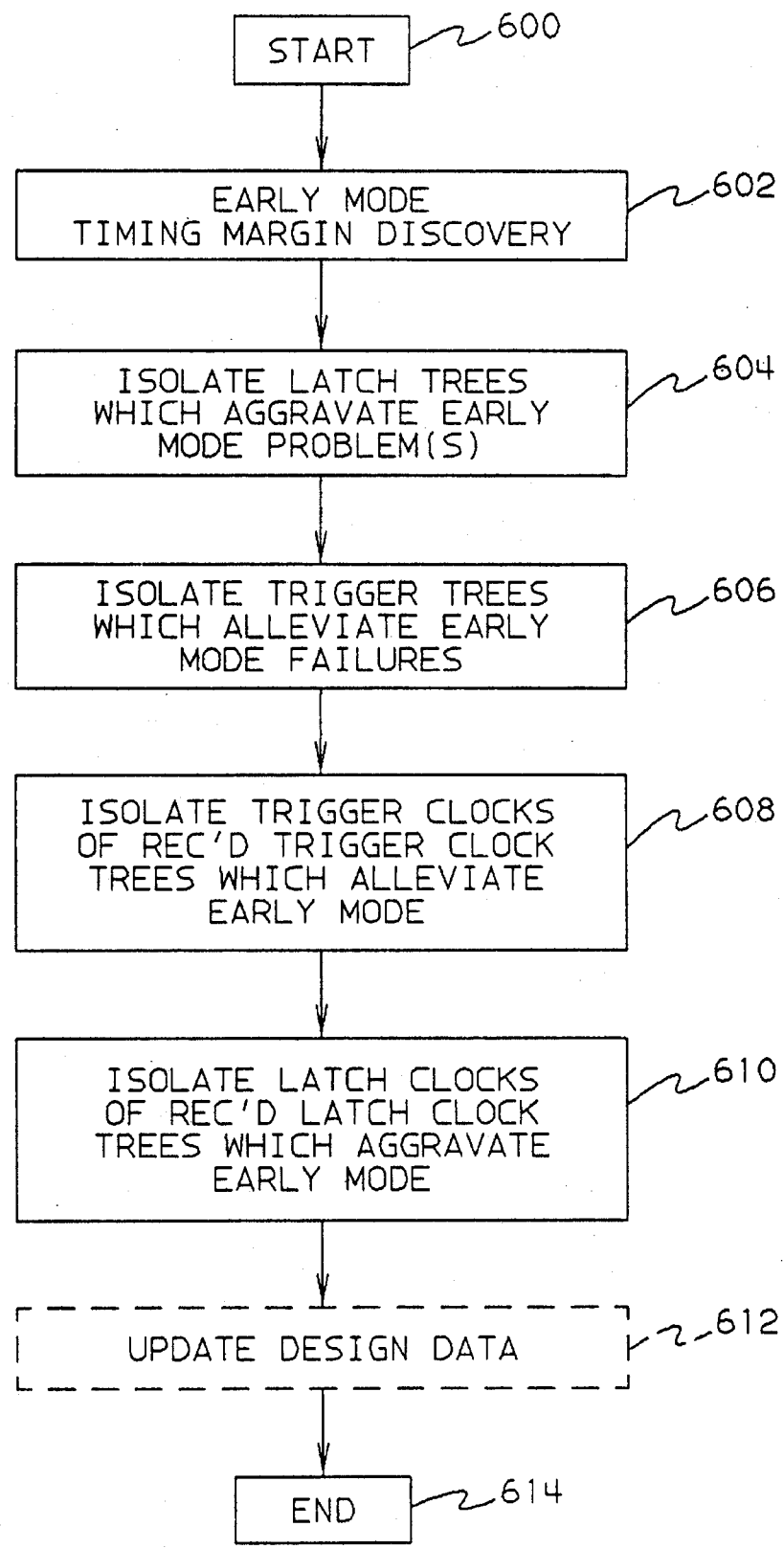
FIG. 17 is a flowchart overview of another embodiment of early mode path stressing pursuant to the present invention.

An overview embodiment of early mode processing in accordance with the invention is presented in FIG. 17. Upon initiating processing, 600 "Start," early mode margin is discovered, 602 "Early Mode Timing Margin Discovery." Thereafter, the aggravating latch trees are identified, 604 "Isolate Latch Trees Which Aggravate Early Mode Problem(s)," along with the alleviating trigger clock trees, 606 "Isolate Trigger Trees Which Alleviate Early Mode Failures." The alleviating trigger clocks are isolated, 608 "Isolate Trigger Clks. Of Rec'd Trigger Clk. Trees Which Alleviate Early Mode," and the aggravating latch clocks are identified, 610 "Isolate Latch Clks. Of Rec'd Latch Clk. Trees Which Aggravate Early Mode." Assuming that timing analysis is occurring during engineering design, it may be desirable to update design data in the processor controller associated with the computer system, 612 "Update Design Data," after which processing is terminated, 614 "End." Processing routines for each of the main functions of FIG. 17 are presented in FIGS. 17a–17e, which are separately discussed below.

Figure 17A:
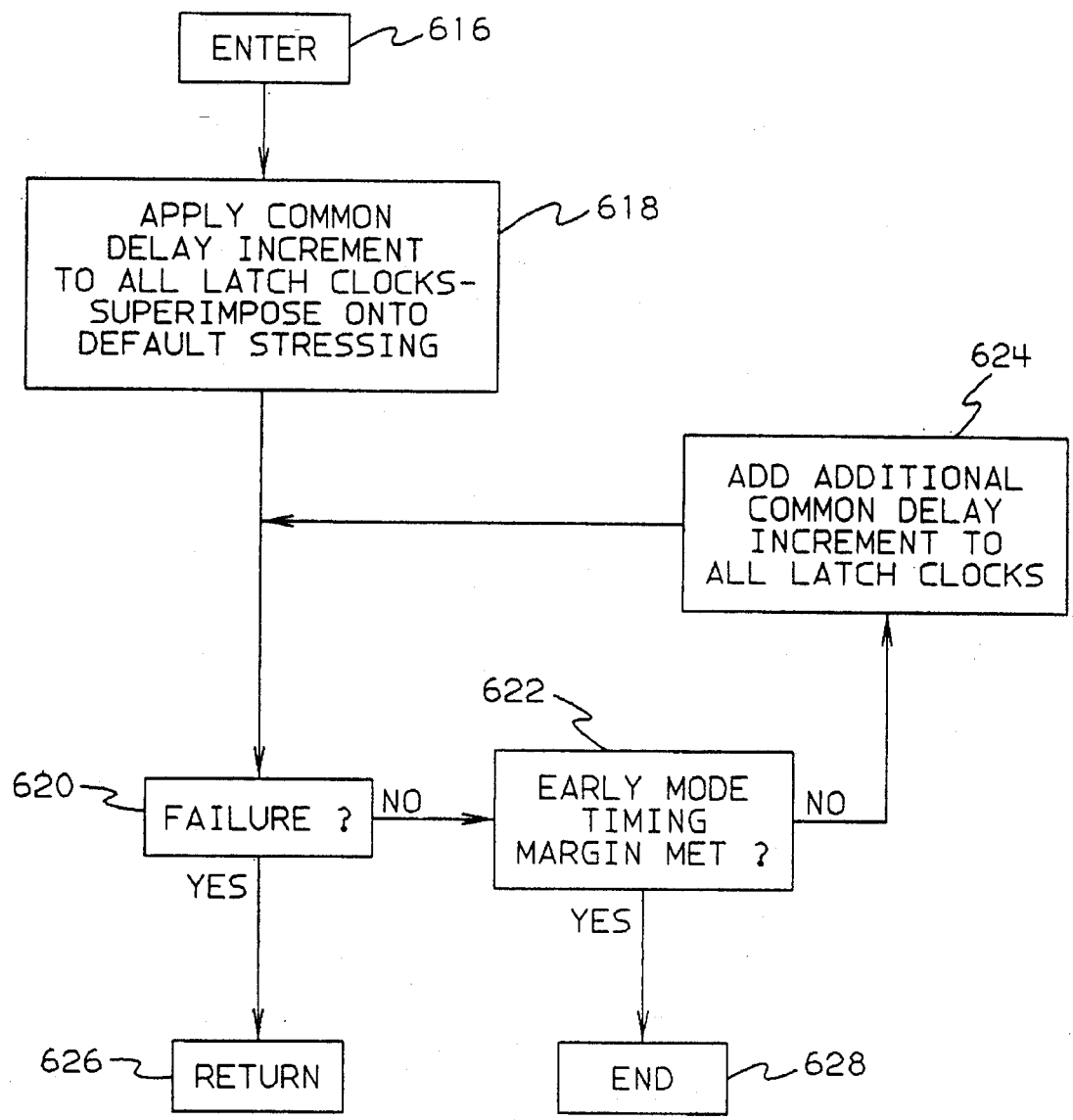
FIG. 17a is a flowchart of one embodiment for early mode timing margin discovery for the timing analysis processing of FIG. 17.

Beginning with FIG. 17a, upon initiating early mode timing margin discovery, 616 "Enter," a common delay increment is applied to all latch clocks, 618 "Apply Common Delay Increment To All Latch Clks.—Superimpose Onto Default Stressing." Processing determines whether failure is detected, 620 "Failure?" If "no," then consideration is given to whether predefined early mode timing margins have been met, 622 "Early Mode Timing Margins Met?" If "yes," then processing terminates, 628 "End;" otherwise, further delay is added to all latch clocks, 624 "Add Add't Common Delay Increment To All Latch Clks." Once a failure condition is detected, return is made to point of call, 626 "Return" (FIG. 17).

Assuming that a failure is detected, then processing next isolates the failure to one or more particular latch clock tree(s). In FIG. 17b processing begins, 630 "Enter," by removing the common delay increment superimposed onto all latch clocks, 632 "Remove Common Delay Increment Superimposed Onto All Latch Clocks." The common delay increment is then re-applied to a selected latch clock tree, 634 "Apply Common Delay Increment To Latch Clk. Tree$_j$; (j=1)," and failure analysis is conducted, 636 "Failure?" If no failure occurs with the common delay increment added to this particular latch clock tree, then a next latch clock tree is selected, 638 "Set Tree$_j$=Tree$_j$+1" and the common delay increment is added to the new latch clock tree. Once a failing tree is identified, its identity is recorded and the common delay increment is removed from the tree so as not to interfere with further testing, 640 "Record Failed Tree$_j$; Remove Common Delay Increment From Tree$_j$." Then, processing considers whether all latch clock trees have been evaluated, 642 "All Latch Clk. Trees Considered?" If "no," a next latch clock tree is selected (instruction 638). Otherwise, return is made to point of call, 644 "Return" (FIG. 17).

Figure 17C:
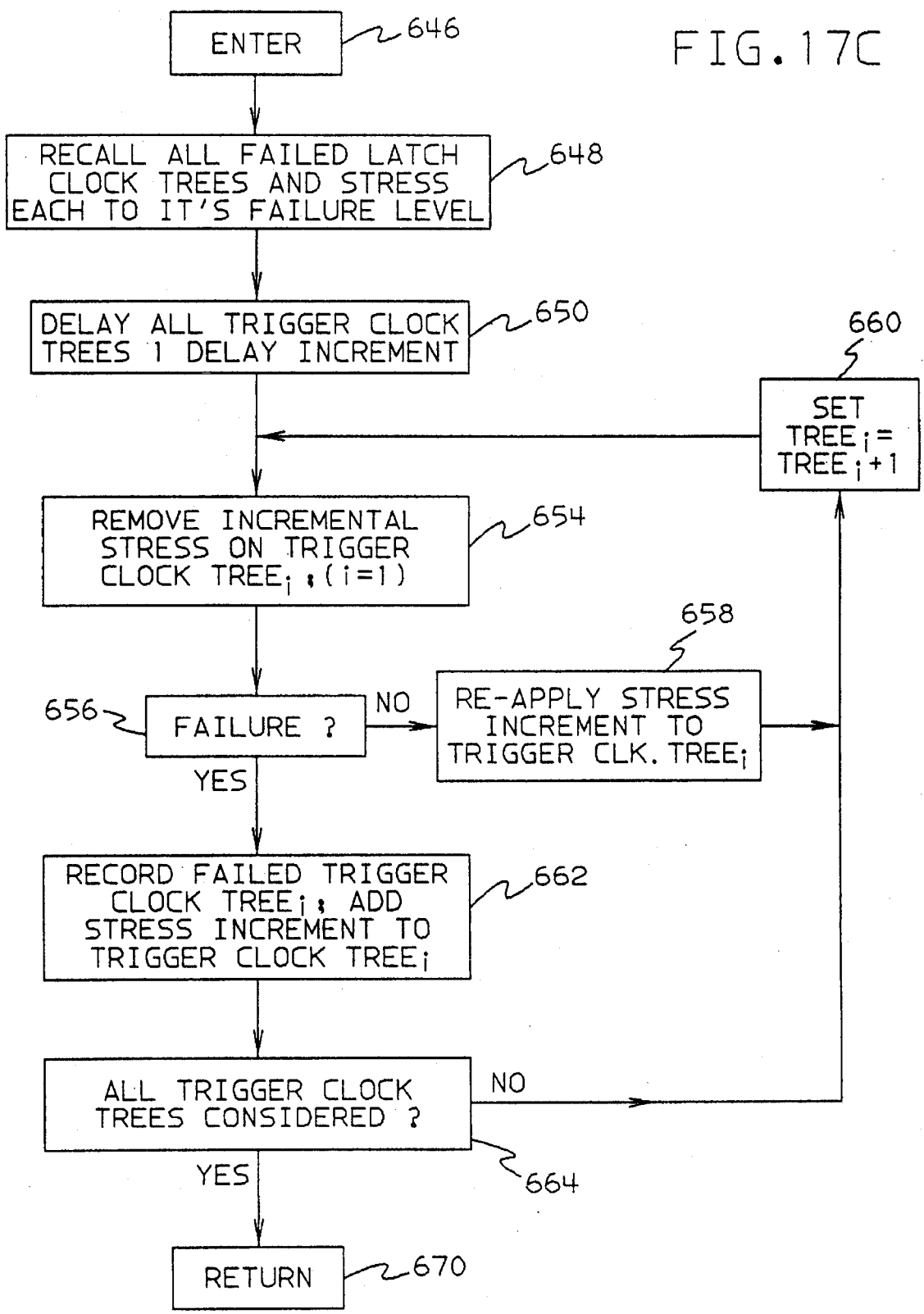
FIG. 17c is a flowchart of one embodiment for isolating alleviating trigger clock trees for the timing analysis processing of FIG. 17.

Once all aggravating latch clock trees are identified, the alleviating trigger clock trees can be discovered via the processing of FIG. 17c which begins, 646 "Enter," by recalling all failed latch clock trees and stressing each tree to its failure level, 648 "Recall All Failed Latch Clk. Trees And Stress Each To Its Failure Level." All trigger clock trees are then delayed one increment, 650 "Delay All Trigger Clk. Trees One Delay Increment."

The incremental stress applied to the trigger clock trees is then removed on one trigger clock Tree$_i$, 654 "Remove Incremental Stress On Trigger Clk. Tree$_i$; (i=1)." Processing considers whether failure is detected, 656 "Failure?" If "no," then the removed stress is reapplied to trigger clock Tree$_i$, 658 "Re-apply Stress Increment To Trigger Clk. Tree$_i$," and a new trigger clock tree$_i$ is selected, 660 "Set Tree$_i$=Tree$_i$+1." Once failure is detected, the trigger clock tree is recorded and the stress increment is reapplied to the recorded trigger clock tree, 662 "Record Failed Trigger Clk. Tree$_i$; Add Stress Increment to Trigger Clk. Tree$_i$." Thereafter, processing determines whether all trigger clock trees have been considered, 664 "All Trigger Clk. Trees Considered?" If "no," then a next trigger clock tree is selected (instruction 660). If "yes," return is made to point of call, 670 "Return" (FIG. 17).

Figure 17D:
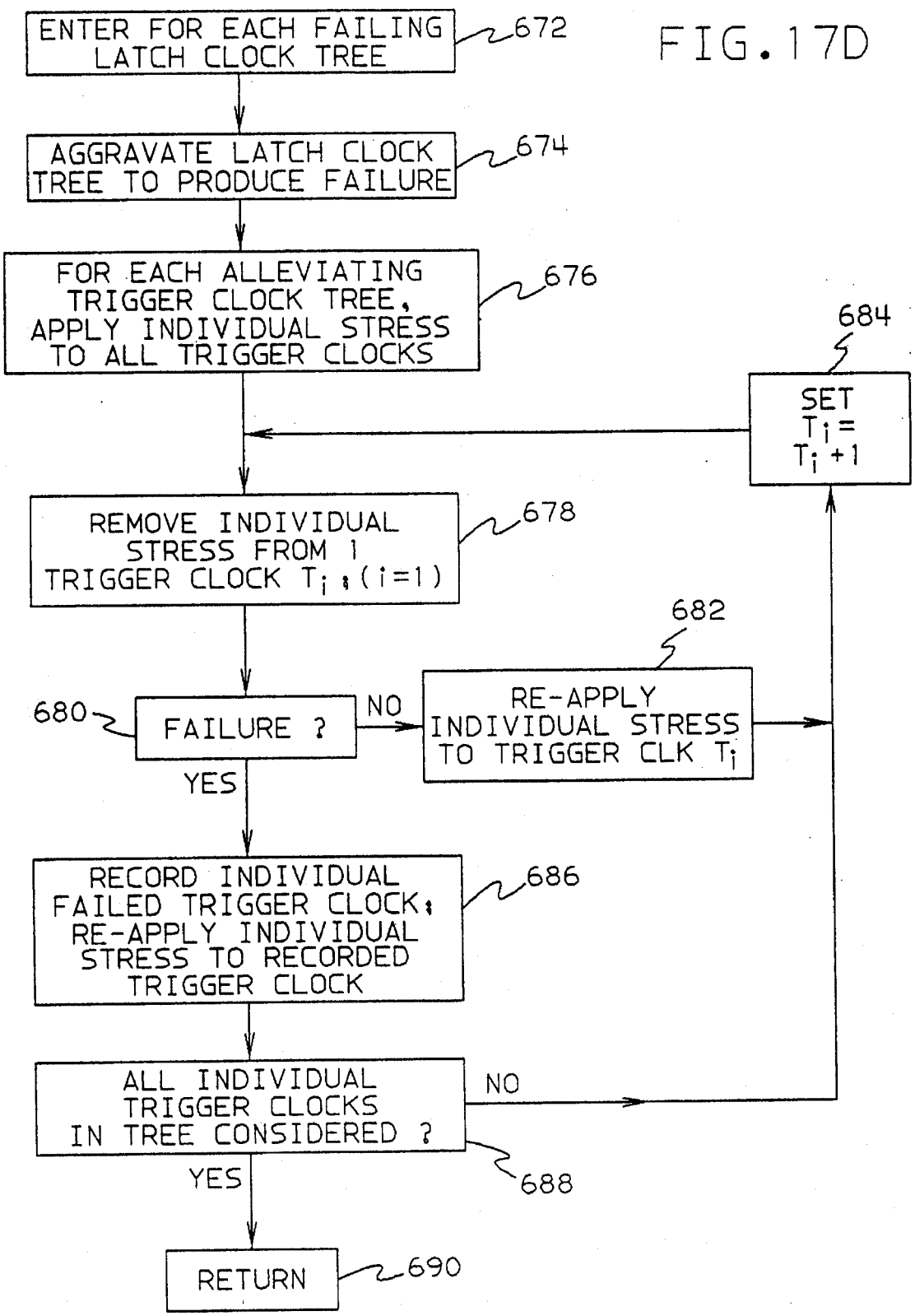
FIG. 17d is a flowchart of one embodiment for isolating alleviating trigger clocks from isolated alleviating trigger clock trees of FIG. 17c.

In FIG. 17d the trigger clocks which alleviate identified early mode failures are isolated. For each failing latch clock tree, 672 "Enter For Each Failing Latch Clk Tree," the latch clock tree is aggravated to produce a failure condition, 674 "Aggravate Latch Clk. Tree To Produce Failure." Then for each alleviating trigger clock tree associated with the failing latch clock tree, an individual stress is applied to all of the trigger clocks therein, 676 "For Each Alleviating Trigger Clk. Tree, Apply Ind. Stress To All Trigger Clks." Stress is then removed from one trigger clock of the alleviating trigger clock tree, 678 "Remove Ind. Stress From One Trigger Clk. $T_i$, (i=1)," and failure checking occurs, 680 "Failure?" If no failure is identified, then the individual stress is reapplied to the selected trigger clock $T_i$, 682 "Reapply Ind. Stress To Trigger Clk $T_i$," and a new individual trigger clock is selected, 684 "Set $T_i = T_i + 1$." Once a failure is identified, the failing trigger clock is recorded and the individual stress is re-applied, 686 "Rec'd Ind. Failed Trigger Clk.; Re-apply Ind. Stress To Rec'd Trigger Clk." Thereafter, processing considers whether all individual trigger clocks have been considered, 688 "All Ind. Trigger Clks. In Tree Considered?" If "no," then a next individual trigger clock is selected (instruction 684). Otherwise, processing returns to point of call, 690 "Return" (FIG. 17).

Figure 17E:
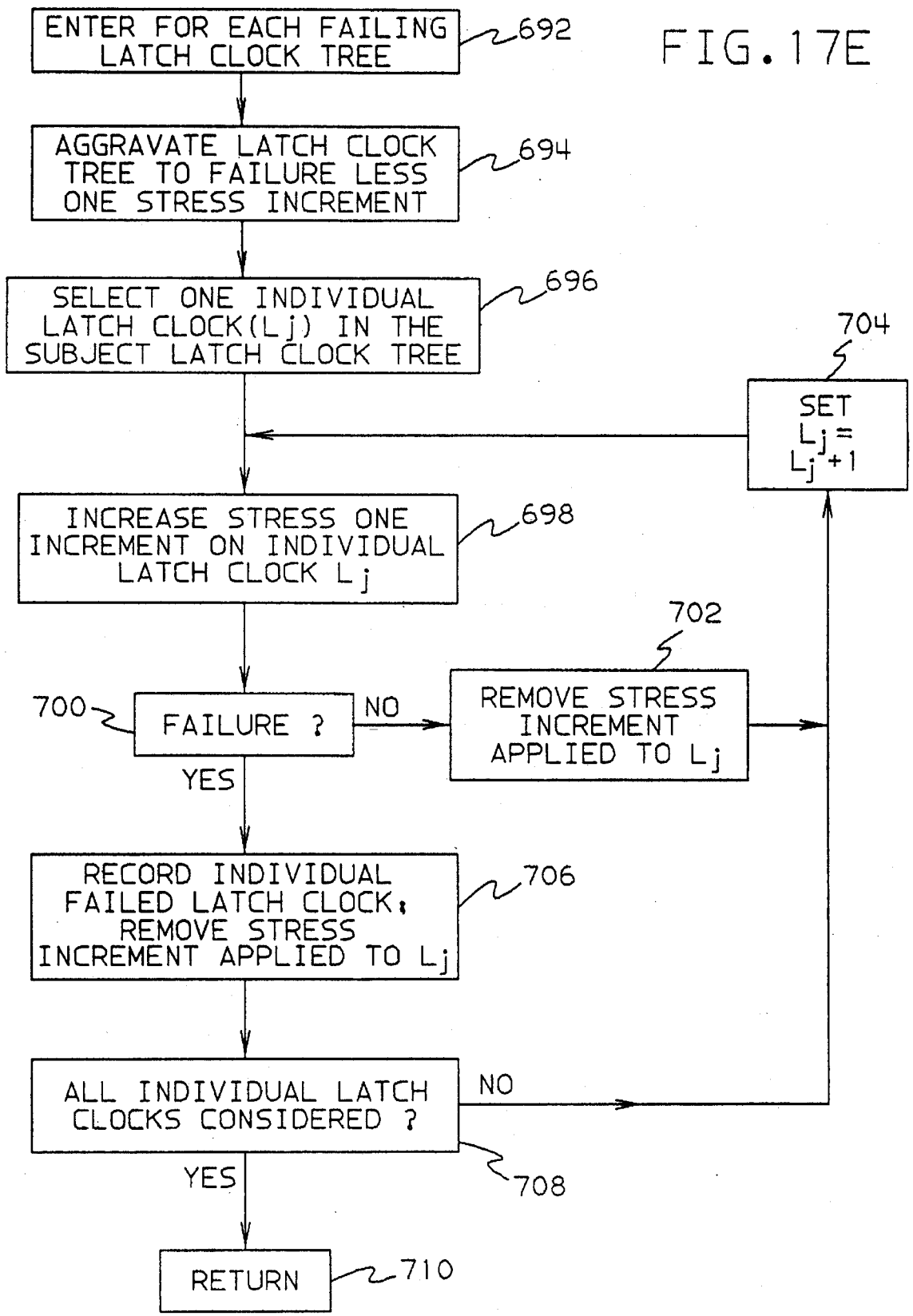
FIG. 17e is a flowchart of one embodiment for isolating aggravating latch clocks from isolated aggravating latch clock trees of FIG. 17b.

Optionally, each aggravating latch clock can be identified using the processing of FIG. 17e. For each failing latch clock tree, 692 "Enter For Each Failing Latch Clk. Tree," the latch clock tree is aggravated to a failing point less one stress increment, 694 "Aggravate Latch Clk. Tree To Failure Less One Stress Increment." An individual latch clock in the tree is selected, 696 "Select One Individual Latch Clk. ($L_j$) In The Subject Latch Clk. Tree," and stress on the selected latch clock is increased one increment, 698 "Increase Stress One Increment On Ind. Latch Clock $L_j$." Processing considers failure, 700 "Failure?" If "no," then the stress increment is removed from latch clock $L_j$, 702 "Remove Stress Increment Applied To $L_j$," and a new individual latch clock is selected, 704 "Set $L_j = L_j + 1$." Processing continues in this loop until failure is detected. Thereafter, the individual failing latch clock is recorded and the applied incremental stress is removed, 706 "Rec'd Ind. Failed Latch Clk.; Remove Stress Increment Applied To $L_j$." Processing then determines whether all individual latch clocks have been considered, 708 "All Ind. Latch Clks. Considered?" If "no," a next individual latch clock in the tree is selected; otherwise, return, 710 "Return," is made to point of call (FIG. 17).

Single-phase and dual-phase examples of clock path balancing in accordance with the invention are next discussed with reference to FIGS. 18–21.

Figure 18:
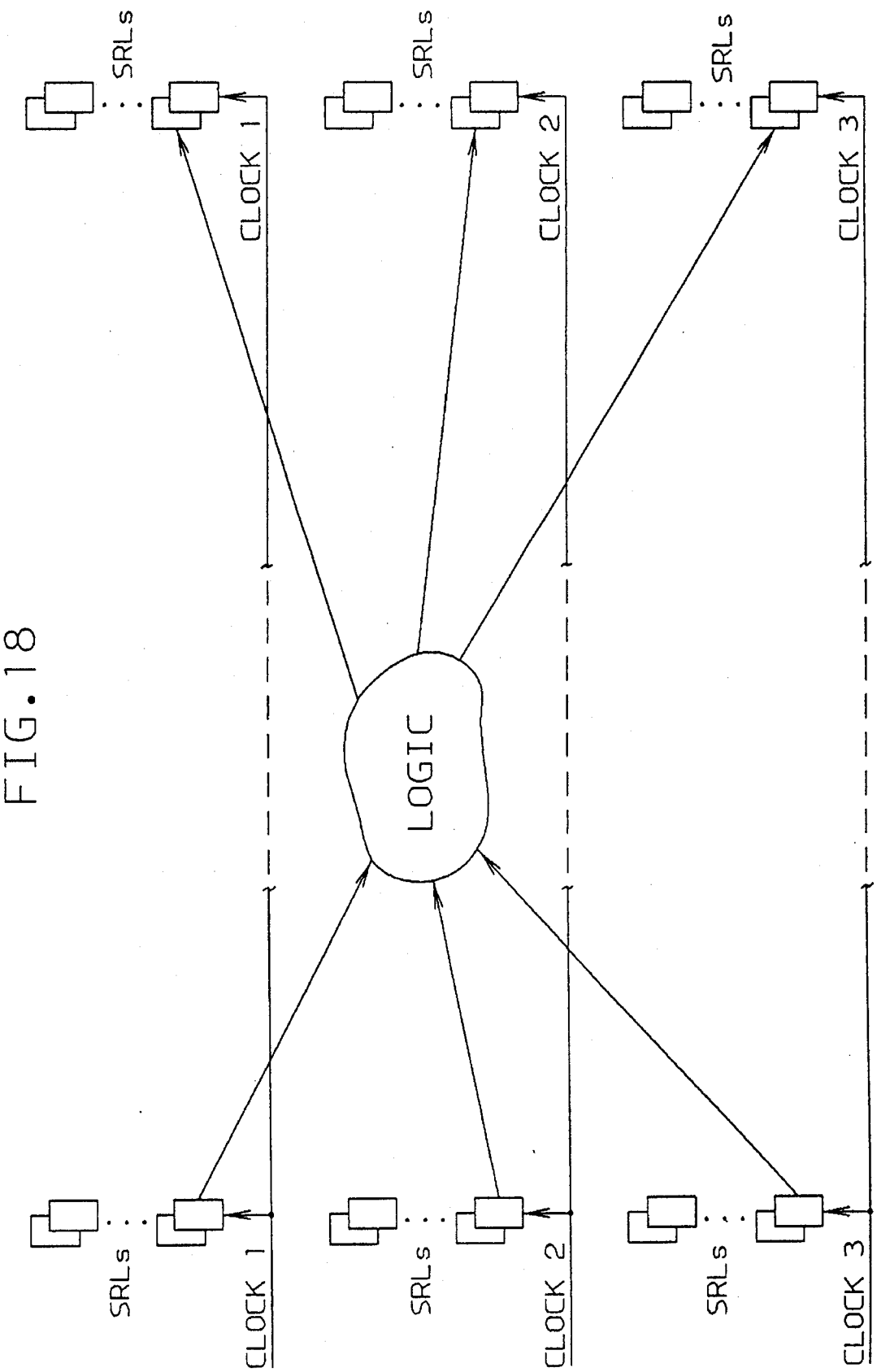
FIG. 18 is an illustration of clock path balancing in a single-phase clock system in accordance with the present invention.

FIG. 18 illustrates a logic connectivity diagram for a single-phase, multiple clock system. In this example, three individually controllable clocks (CLOCK 1, CLOCK 2, and CLOCK 3) of the same frequency are used to control launching and capturing shift register latches (SRLs) within a computer system. The same clock signal is connected to multiple SRLs to provide both launch and capture clocking signals at the respective registers.

From the diagram presented, there exists at least one path from each source clock domain to each destination clock domain. To better illustrate clock phase balancing pursuant to the invention, assume that the following table represents the worst, or longest, path delay from one clock section to another.

TABLE 1

| CLOCK SOURCE | CLOCK DESTINATION | LONGEST PATH DELAY |
|---|---|---|
| 1 | 1 | 7 ns |
| 1 | 2 | 7 ns |
| 1 | 3 | 6 ns |
| 2 | 1 | 6 ns |
| 2 | 2 | 6 ns |
| 2 | 3 | 4 ns |
| 3 | 1 | 10 ns |
| 3 | 2 | 7 ns |
| 3 | 3 | 7 ns |

Assume further for this example that all clocks are phase aligned at relative time zero (T0) and that the period of each clock has a cycle time of 12 ns. This means that SRLs will launch data at time T0, logical pulses will propagate through the various paths and arrive at the destination SRLs no later than the values shown above. The next active transition of the clocks occurs at time T12 (i.e., 12 ns after time T0 based on the clock frequency). The time by which arriving, stabilized data precedes the capturing clock is known at the slack or "timing margin". For example, the above worst path from clock 3 to clock 1 has 2 ns slack at 12 ns. The formula can be expressed as capture_clock−(path_delay+launch_clock). Also assume that it is desirable to operate the machine at the fastest frequency possible while maintaining a predefined timing margin of 1 ns for manufacturing yield and reliability protection. This means that for the example presented, the clock signals could operate at a cycle time of 11 ns (10 ns path delay plus 1 ns slack margin). The present invention allows the machine to operate at a faster clock cycle than the original limit by 'tuning' the clocks to meet the constraints of the hardware.

Figure 19A:
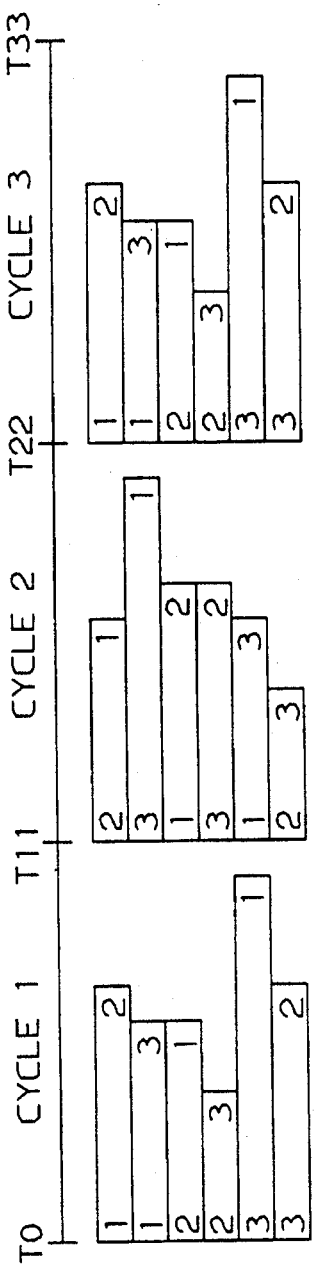
FIGS. 19a–19c depict timing diagrams for the illustration of FIG. 18 wherein the cycle time is successively reduced employing clock path balancing in accordance with the present invention.
Figure 19B:
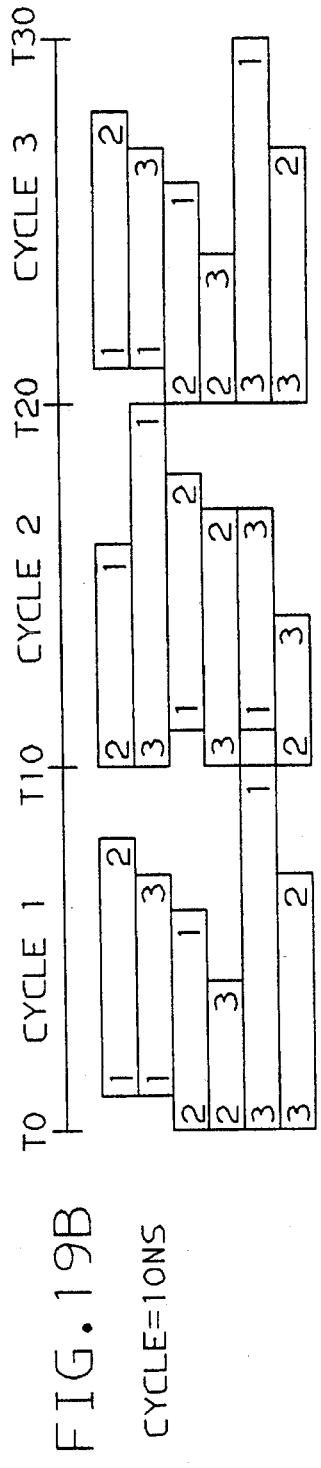

FIG. 19a shows a timing diagram which represents Table 1. The paths from CLOCK 1 to CLOCK 1, CLOCK 2 to CLOCK 2, and CLOCK 3 to CLOCK 3 have been omitted. Since these have a worst-case delay of 7 ns they will operate at an 8 ns cycle time with a 1 ns margin. It is preferable that clocks be connected such that these 'common source—sink clock paths' do not comprise critical timing paths.

In FIG. 19a, the machine cycle time has been cycled down to 11 ns. The horizontal bars each represent the delay from a clock transition (denoted at the beginning of the bar) to a next clock transition (denoted at the end of the bar). The bars are then repeated each cycle showing when the next cycle's information is launched (at T11, T22, T33, etc.). As shown, path 3 to path 1 has a 1 ns margin on every cycle. Thus, any faster cycle time will erode this margin and cause potential timing failures.

There are two approaches to further cycling down on the machine. Namely:

1. To modify the hardware (chips, wires, etc.) for the CLOCK 3 to CLOCK 1 logic path to shorten the path delay. Drawbacks to this approach include cost and time required to perform.

2. To delay only the receiving clocks involved in the critical paths. This is the approach pursued by the present invention. (The prior art might have had CLOCK 1, CLOCK 2 and CLOCK 3 on the same clock tree rendering this second approach impossible.)

Since the only path that does not have more than a 1 ns of slack is from CLOCK 3 to CLOCK 1, CLOCK 1 is phase shifted or delayed by 1 ns. This allows a further cycling down of machine operating speed to 10 ns. Notice that each path still has a margin of 1 ns prior to the capturing clock (See FIG. 19b).

Assume that further cycle down is desired. To accomplish this observe that CLOCK 1 is again close to failure. Therefore, CLOCK 1 must be delayed an additional amount. However, this would in turn delay the CLOCK 1 to CLOCK 2 path another 1 ns and would not support the margin of 1 ns. Therefore, CLOCK 2 must also be delayed 1 ns to maintain timing margin. There are no adverse effects caused by delaying CLOCK 2.

Figure 19C:
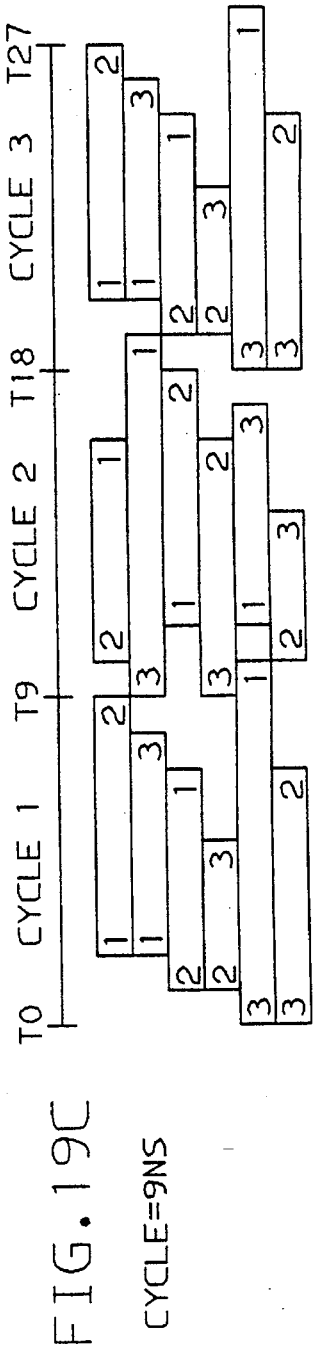

FIG. 19c illustrates the result of delaying CLOCK 1 by 2 ns from T0, CLOCK 2 by 1 ns from T0 and cycling the machine down to 9 ns. The result is that the machine is running 2 ns faster with the invention than the same hardware without the present invention. Paths from CLOCK 1 to CLOCK 3, and CLOCK 3 to CLOCK 1 both have exactly 1 ns of margin. Delaying CLOCK 3 will help path 1→3, while hurting path 3→1. Conversely, delaying clock 1 will help path 3→1, while hurting path 1→3. Therefore, the limits according to this invention have been reached.

However, there may be an opportunity to even further improve machine operating speed. This may be possible by separating CLOCK 1 into two individually stressable clocks, CLOCK 1a and CLOCK 1b. The following table shows one example of how CLOCK 1 might have been separated either by design or by chance.

TABLE 2

| CLOCK SOURCE | CLOCK DESTINATION | LONGEST PATH DELAY |
|---|---|---|
| 1a | 1a | 7 ns |
| 1a | 1b | 7 ns |
| 1a | 3 | 4 ns |
| 1b | 1a | 7 ns |
| 1b | 1b | 7 ns |
| 1b | 3 | 6 ns |
| 3 | 1a | 10 ns |
| 3 | 1b | 8 ns |
| 3 | 3 | 7 ns |

The limits can be calculated by making sure that all combinations of multiple-cycle loops average the maximum path delay allowed over those cycles. For example, to meet an 8 ns cycle time with 1 ns slack, there is 7 ns allowed path delay on average per cycle. A two-cycle loop will allow path delays of 14 ns. Table 3 presents a summary of all two-cycle loops.

TABLE 3

| LOOP | TOTAL DELAY |
|---|---|
| 1a-1a-1a | 7 + 7 = 14 |
| 1a-1b-1a | 7 + 7 = 14 |
| 1a-3-1a | 4 + 10 = 14 |
| 1b-1a-1b | 7 + 7 = 14 |
| 1b-1b-1b | 7 + 7 = 14 |
| 1b-3-1b | 6 + 8 = 14 |
| 3-1a-3 | 10 + 4 = 14 |
| 3-1b-3 | 8 + 6 = 14 |
| 3-3-3 | 7 + 7 = 14 |

Assuming that only clock source '1b' communicates with CLOCK 2 as well, then FIG. 20 illustrates that it is possible using this invention to have the machine meet an 8 ns cycle time with 1 ns margin minimum on every path. In this case, the phase delays introduced by this invention are: CLOCK 1a is delayed 3 ns; CLOCK 1B is delayed 1 ns; and CLOCK 2 is delayed 2 ns.

Figure 21B:
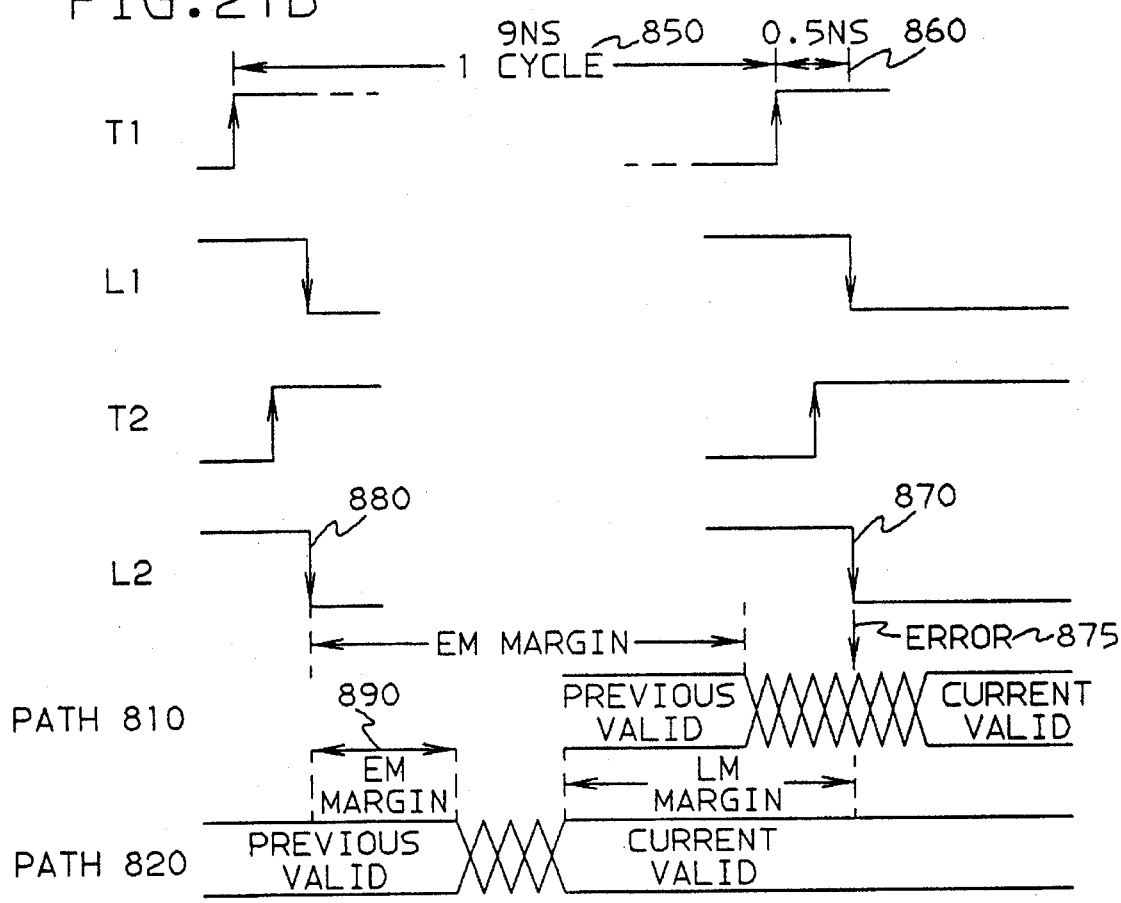

FIGS. 21a and 21b depict early mode versus late mode trade-off in a data processing system employing trigger clocks and latch clocks. In FIG. 21a a launch SRL 800 is controlled by two clocks in a common mode (T1 to launch, L1 to capture). The capturing SRL 805 is controlled by two clocks as well, T2 to launch and L2 to capture. A logic path 810 with the longest delay between SRL1 and SRL2 exists. Other logic paths 820, 830, and 840 exist which are the shortest logic paths from SRL2 to SRL2, SRL1 to SRL2, and SRL1 to SRL1, respectively. By way of example, path delays are shown to illustrate the process by which early mode margin in path 820 is decreased in order to provide late mode margin in path 810.

FIG. 21b illustrates the clock and data path timings. The trigger-to-trigger cycle time 850 is shown by example to be 9 ns. The additional latch delay or so called overlap 860 is by example 0.5 ns for both T1 to L1 and T2 to L2. The falling L2 clock edge 870 in this example is responsible for capturing valid data for the current cycle. This is a requirement for every cycle. If current data is valid after the time of edge 870 but not valid before or during 870 it is referred to as a late mode timing problem and may cause functional machine failure. Path 810 in this example has a late mode problem 875.

There is also a requirement that valid data cannot arrive at latch SRL2 until after the first L2 transition 880 occurs. This is because valid data from the previous cycle has not yet been captured. A timing failure at this point is referred to as an early mode timing problem. For SRL 805 there are no early mode problems and because path 820 is the shortest it has the least early mode margin 890. The margin 890, however, is still more than the minimum required.

Figure 21C:
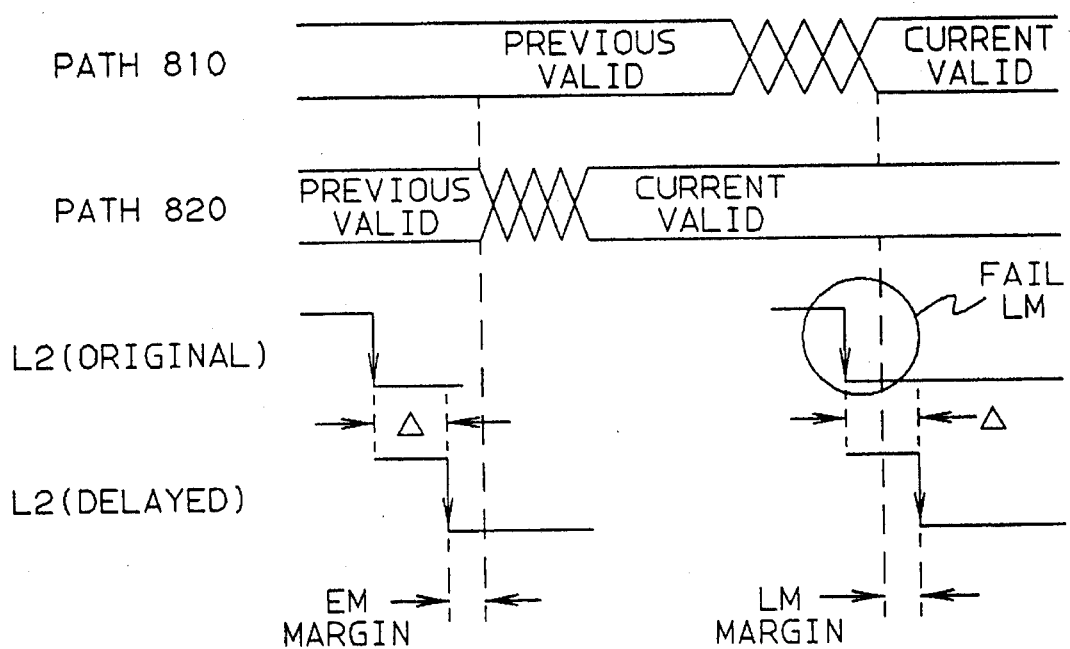

In order to take advantage of the invention using the two phase clock system, the L2 clock should be delayed sufficiently to fix the error 875. However, because edges 880 and 870 are both delayed, the early mode margin 890 is decreased. FIG. 21c shows that delaying the L2 clock an amount 'Δ' provides sufficient early and late mode margins.

If there is not ample early mode margin at the destination, it is still possible to adjust the path. Both the T2 and L2 clocks can be delayed. This improves the margin on latch SRL 1 to latch SRL 2 path without affecting any of the SRL 2 to SRL 2 paths. However, analysis should consider the paths originating from SRL 2 to ensure that there is no subsequent late mode problem. Such a system would behave like a single-phase clock system.

By way of summary, processing in according with the invention can include:

1. Cycle down to timing margin failure.
2. Increasing cycle time until just above timing margin failure.
3. Applying a trigger clock stress. For any late mode failure, delaying all latches that alleviate these late mode timing margin problems.
4. Adopting these latch clocks as the new design defaults. Recoding the offending trigger clocks.
5. Applying latch clock stress. For any early mode failure, delaying all triggers that fix these early mode problems.
6. Adopting these trigger clocks as the new defaults. Recoding the offending latch codes.
7. Repeating steps 1–6 with the new defaults.
   (i) If any trigger clocks in step (4) matches any in step (5), the limit has been reached.
   (ii) If any latch clock in step (3) matches any latch clock of step (6), the limit has been reached.

Those skilled in the art will note from the above discussion that a programmable clock tuning system and method are provided herein where an individual clock stress capability ensures selective tuning of clock pulses distributed through a computer system. It is significant to note that the system and method presented allow performance of timing analysis in a matter of minutes and allow the unlayering of a significantly greater number of timing problems. By unlayering a greater number of timing margin problems, ultimate cycle speed is able to be increased, thereby improving system performance and providing a competitive advantage. The system and method presented allow isolation of timing margin failures to specific clock signals.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the scope of the invention. The following claims are intended to encompass all such modifications.

What is claimed is:

1. In a data processing system having a cycle time and multiple logic paths wherein a first device provides output data to a first logic path in response to a first clock signal, a second device stores input data from the first logic path in response to a second clock signal, and wherein the second device provides output data to a second logic path in response to the second clock signal and a third device captures input data from the second logic path in response to a third clock signal, the first logic path and the second logic path each having its own timing margin, a clock tuning system for providing said first clock signal to said first device, said second clock signal to said second device, and said third clock signal to said third device, said clock tuning system comprising:

individual clock adjusting means for varying a phase of the second clock signal, said clock adjusting means comprising means for selectively adjusting the phase of said second clock signal such that either timing margin of the first logic path is at least partially transferred to the timing margin of the second logic path without degrading cycle time of the data processing system, or timing margin of the second logic path is at least partially transferred to the timing margin of the first logic path without degrading cycle time of the data processing system.

2. The clock tuning system of claim 1, wherein said means for selectively adjusting the phase of said second clock signal includes means for shifting the phase of said second clock signal later such that capture of input data from the first logic path by the second device is delayed and such that launching of output data from the second device to the second logic path is delayed.

3. The clock tuning system of claim 1, wherein said means for selectively adjusting the phase of said second clock signal includes means for shifting the phase of said second clock signal earlier such that capture of input data from the first logic path by the second device occurs earlier and such that launching of output data from the second device to the second logic path occurs earlier.

4. The clock tuning system of claim 1, wherein said means for selectively adjusting the phase of said second clock signal comprises means for conducting timing margin analysis by aggravating one of the timing margin of the first logic path and the timing margin of the second logic path.

5. The clock tuning system of claim 4, wherein said means for selectively adjusting the phase of said second clock signal comprises means for enhancing data system performance by alleviating one of the timing margin of the first logic path and the timing margin of the second logic path.

6. The clock tuning system of claim 4, wherein said means for aggravating further includes means for detecting a minimum acceptable time interval between said first and second clock signals for transfer of data through said first logic path and a minimum acceptable time interval between said second and third clock signals for transfer of data through said second logic path.

7. The clock tuning system of claim 1, wherein said means for selectively adjusting a phase of said second clock signal comprises means for enhancing data system performance by alleviating one of the timing margin of the first logic path and the timing margin of the second logic path.

8. The clock tuning system of claim 1, wherein said first device, said second device and said third device comprise shift register latches.

9. In a data processing system having a cycle time and multiple logic paths wherein a first device provides output data to a first logic path in response to a first clock signal, a second device stores input data from the first logic path in response to a second clock signal, a third device provides output data to a second logic path in response to a third clock signal, and the second device stores input data from the second logic path in response to the second clock signal, the first logic path and the second logic path each having an associated late mode timing margin and an associated early mode timing margin, a clock tuning system for providing said first clock signal to said first device, said second clock signal to said second device, and said third clock signal to said third device, said clock tuning system comprising:

individual clock adjusting means for varying a phase of the second clock signal, said clock adjusting means comprising means for selectively adjusting the phase of the second clock signal such that either late mode timing margin of the first logic path is at least partially transferred to the early mode timing margin of the second logic path without degrading cycle time of the data processing system, or early mode timing margin of the first logic path is at least partially transferred to the late mode timing margin of the second logic path without degrading cycle time of the processing system.

10. The clock tuning system of claim 9, wherein said means for selectively adjusting the phase of said second clock signal comprises means for conducting late mode timing margin analysis by aggravating one of the late mode timing margin of the first logic path and the late mode timing margin of the second logic path.

11. The clock tuning system of claim 9, wherein said means for selectively adjusting the phase of said second clock signal comprises means for conducting early mode timing margin analysis by aggravating one of the early mode timing margin of the first logic path and the early mode timing margin of the second logic path.

12. The clock tuning system of claim 9, wherein said means for selectively adjusting the phase of the second clock signal comprises means for enhancing data system performance by alleviating one of the late mode timing margin of the first logic path and the late mode timing margin of the second logic path.

13. The clock tuning system of claim 9, wherein said means for selectively adjusting the phase of said second clock signal comprises means for enhancing data system performance by alleviating one of the early mode timing margin of the first logic path and the early mode timing margin of the second logic path.

14. A data processing system having an established cycle time, said data processing system comprising:

a first logic device, a second logic device, and a third logic device;

a first logic path interconnecting the first logic device and the second logic device;

a second logic path interconnecting the second logic device and the third logic device;

clocking apparatus coupled to each of said first logic device, said second logic device and said third logic device for providing clocking signals thereto, said clocking apparatus providing a first clocking signal to said first logic device such that said first logic device provides output data to the first logic path, said clocking apparatus providing a second clocking signal to the second logic device such that the second logic device stores input data from the first logic path and provides output data to the second logic path, and said clocking apparatus providing a third clocking signal to the third logic device such that the third logic device stores input data from the second logic path; and clock tuning means for adjusting a phase of the second clock signal relative to one of the first clock signal and the third clock signal such that either timing margin of the first logic path is at least partially transferred to the timing margin of the second logic path without degrading established cycle time of the data processing system, or timing margin of the second logic path is at least partially transferred to the timing margin of the first logic path without degrading established cycle time of the data processing system.

15. The data processing system of claim 14, wherein said means for adjusting the phase of said second clock signal includes means for shifting the phase of said second clock signal later such that capture of input data from the first logic path by the second device is delayed and such that launching of output data from the second device to the second logic path is delayed.

16. The data processing system of claim 14, wherein said means for adjusting the phase of said second clock signal includes means for shifting the phase of said second clock signal earlier such that capture of input data from the first logic path by the second device occurs earlier and such that launching of output data from the second device to the second logic path occurs earlier.

17. The data processing system of claim 14, wherein said means for adjusting the phase of said second clock signal comprises means for conducting timing margin analysis by aggravating one of the timing margin of the first logic path and the timing margin of the second logic path.

18. The data processing system of claim 14, wherein the means for adjusting the phase of the second clock signal comprises means for enhancing data system performance by alleviating one of the timing margin of the first logic path and the timing margin of the second logic path.

19. The data processing system of claim 14, wherein said first device, said second device and said third device comprise shift register latches.

20. A programmable clock tuning system for a data processing system, said programmable clock tuning system comprising:

first logic means connected to receive a reference clock signal and output in response thereto a common clock signal, said first logic means including programmable macro means for selectively superimposing a common phase adjustment onto said common clock signal;

second logic means coupled to receive the common clock signal output from said first logic means and output in response thereto a plurality of individual clock signals, said second logic means including programmable micro means for selectively superimposing an individual phase adjustment onto each individual clock signal of said plurality of individual clock signals; and controller means coupled to said first logic means for controlling said programmable macro means' selective superimposing of common phase adjustment onto said common clock signal and coupled to said second logic means for controlling said programmable micro means' selective superimposing of individual phase adjustment onto at least one individual clock signal of said plurality of individual clock signals, said controller means including means for controlling adjustment of the phase of the common clock signal and the phase of each individual clock signal to either enhance performance of the data processing system or conduct timing margin analysis of the data processing system.

21. The programmable clock tuning system of claim 20, wherein said programmable macro means of said first logic means includes means for superimposing one of a plurality of common phase delays onto said common clock signal output from said first logic means, and wherein said programmable micro means includes means for superimposing one of a plurality of individual phase delays onto each individual clock signal output from said second logic means.

22. The programmable clock tuning system of claim 21, wherein said controller means includes a macro control means coupled to said programmable macro means of said first logic means, said macro control means controlling selection of the common phase delay superimposed upon the common clock signal, and wherein said controller means includes a micro control means coupled to the programmable micro means of said second logic means, said micro control means controlling selection of the individual phase delay superimposed onto each individual clock signal output from said second logic means.

23. The programmable clock tuning system of claim 20, wherein the programmable clock tuning system is employed to enhance performance of the data processing system and wherein said controller means further includes a design data database containing a table of control signals which includes defaults for superimposing of the common phase adjustment onto the common clock signal and for superimposing of one of a plurality of individual phase adjustments onto each individual clock signal of the plurality of individual clock signals.

24. A method for conducting timing margin analysis of a data processing system having multiple logic paths timed by multiple clock signals wherein each logic path of the multiple logic paths has an associated timing margin, and wherein a predefined acceptable timing margin exists for the multiple logic paths, said method comprising the steps of:

(a) providing at least one common clock signal in response to an input clock signal;

(b) providing a plurality of individual clock signals in response to each common clock signal such that there is at least one plurality of individual clock signals;

(c) phase adjusting the at least one common clock signal to aggravate at least some timing margins of the multiple logic paths in the data processing system;

(d) simultaneous with said step (c), detecting whether a logic path of the multiple logic paths in the data processing system fails to have the predefined acceptable timing margin such that a timing margin failure exists within the data processing system; and (e) when timing margin failure is detected in said step (d), identifying one individual clock signal from the at least one plurality of individual clock signals provided in step (b) which either aggravates the timing margin failure detected in said step (d) or alleviates the timing margin failure detected in said step (d) without degrading cycle time of the data processing system.

25. The method of claim 24, wherein said step (e) comprises identifying one individual clock signal from the at least one plurality of individual clock signals provided in said step (b) which aggravates the timing margin failure detected in said step (d) by:
   (i) discontinuing the common clock signal phase adjusting of said step (c) and phase adjusting an individual clock signal of the at least one plurality of individual clock signals provided in said step (b);
   (ii) simultaneous with said step (i), detecting whether the timing margin failure of said step (d) is re-created; and
   (iii) repeating said step (ii) while phase adjusting a different individual clock signal of the at least one plurality of individual clock signals until identifying one individual clock signal from the at least one plurality of individual clock signals provided in said step (b) which when phase adjusted recreates the timing margin failure.

26. The method of claim 24, wherein said step (e) comprises identifying one individual clock signal from the at least one plurality of individual clock signals provided in said step (b) which alleviates the timing margin failure detected in said step (d) by:
   (i) continuing the common clock signal phase adjusting of said step (c) and phase adjusting an individual clock signal of the at least one plurality of individual clock signals provided in said step (b);
   (ii) simultaneous with said step (i), detecting whether the timing margin failure of said step (d) is alleviated; and
   (iii) repeating said step (ii) while phase adjusting a different individual clock signal of the at least one plurality of individual clock signals until identifying one individual clock signal from the at least one plurality of individual clock signals provided in said step (b) which when phase adjusted alleviates the timing margin failure of said step (d).

27. The method of claim 24, wherein said multiple clock signals include trigger clocks and latch clocks, and wherein said method of timing margin analysis comprises a method for evaluating late mode timing margin within the data processing system, and wherein said phase adjusting of said step (c) includes applying a common delay to the at least one common clock signal to aggravate at least some timing margins of the multiple logic paths in the data processing system, and said step (d) includes detecting whether a logic path has a late mode timing margin failure.

28. The method of claim 24, wherein said multiple clock signals include trigger clocks and latch clocks, and wherein said method of timing margin analysis comprises a method for evaluating early mode timing margin within the data processing system, and wherein said phase adjusting of said step (c) includes applying a common delay to the at least one common clock signal to aggravate at lease some timing margins of the multiple logic paths in the data processing system, and said step (d) includes detecting whether a logic path has an early mode timing margin failure.

29. In a data processing system having multiple logic paths and a clocking apparatus including at least two clock trees which provide clock signals of a first type and clock signals of a second type, each clock tree receiving an input clock signal and providing in response thereto a common clock signal and a plurality of individual output clock signals in response to each common clock signal, each individual output clock signal being either a clock signal of the first type or a clock signal of the second type, a method for timing margin analysis of the multiple logic paths in the data processing system, said method comprising the steps of:
   (a) conducting timing margin analysis of each clock tree providing a clock signal of the first type, said conducting of timing margin analysis including for each clock tree separately aggravating its common clock signal and identifying each clock tree resulting in a timing margin failure;
   (b) simultaneous with aggravating at least one clock tree, conducting timing margin analysis of each clock tree providing a clock signal of the second type by separately alleviating the tree's common clock signal and identifying each clock tree alleviating the timing margin failure of said step (a); and
   (c) either isolating from the clock tree(s) identified in said step (a) one individual clock signal of the first type which aggravates the timing margin failure or isolating from the clock tree(s) identified in said step (b) one individual clock signal of the second type which alleviates the timing margin failure.

30. The timing margin analysis method of claim 29, further comprising the step of conducting said steps (a)–(c) on the data processing system at a customer location.

31. The timing margin analysis method of claim 30, wherein said step (c) comprises tuning the data processing system by alleviating the timing margin failure isolated from the clock tree(s) identified in said step (b).

32. A method for field testing timing margins of a data processing system having multiple logic paths and a clocking apparatus including at least two clock trees which provide clock signals of a first type and clock signals of a second type, each clock tree receiving an input clock signal and providing in response thereto a common clock signal and a plurality of individual output clock signals in response to each common clock signal, each individual output clock signal being either a clock signal of the first type or a clock signal of the second type, said data processing system being responsive to a processor controller, said method comprising the steps of:
   (a) operator activating of timing margin analysis through the processor controller coupled to the data processing system;
   (b) conducting timing margin analysis of each clock tree providing a clock signal of the first type, said conducting of timing margin analysis including for each clock tree separately aggravating its common clock signal and identifying each clock tree resulting in a timing margin failure;
   (c) simultaneous with aggravating at least one clock tree, conducting timing margin analysis of each clock tree providing a clock signal of the second type by separately alleviating the tree's common clock signal and identifying each clock tree alleviating the timing margin failure of said step (b); and
   (d) employing the processor controller to either isolate from the clock tree(s) identified in said step (b) an individual clock signal of the first type which aggravates the timing margin failure or isolate from the clock tree(s) identified in said step (c) one individual clock signal of the second type which alleviates the timing margin failure.

* * * * *